United States Patent
Renna et al.

(10) Patent No.: US 7,585,743 B2
(45) Date of Patent: Sep. 8, 2009

(54) MANUFACTURING METHOD FOR A SEMICONDUCTOR SUBSTRATE COMPRISING AT LEAST A BURIED CAVITY AND DEVICES FORMED WITH THIS METHOD

(75) Inventors: Crocifisso Marco Antonio Renna, Gela (IT); Luigi La Magna, Scordia (IT); Simona Lorenti, Catania (IT); Salvatore Coffa, Tremestieri Etneo (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/724,841

(22) Filed: Mar. 16, 2007

(65) Prior Publication Data

US 2007/0181920 A1  Aug. 9, 2007

Related U.S. Application Data

(62) Division of application No. 10/726,005, filed on Dec. 1, 2003, now Pat. No. 7,193,256.

(30) Foreign Application Priority Data

Nov. 29, 2002  (EP) ................... 02425742

(51) Int. Cl.
 *H01L 21/76* (2006.01)
 *H01L 21/20* (2006.01)
 *H01L 21/36* (2006.01)

(52) U.S. Cl. ............. 438/421; 438/422; 438/479; 438/E21.561; 438/E21.566

(58) Field of Classification Search ............. 438/455, 438/422, 701, 421, 479, E21.561, E21.566
See application file for complete search history.

(56) References Cited

U.S. PATENT DOCUMENTS

| 5,322,811 | A |   | 6/1994  | Komuro et al. |
|-----------|---|---|---------|---------------|
| 5,324,683 | A |   | 6/1994  | Fitch et al. |
| 5,458,734 | A | * | 10/1995 | Tsukamoto ............... 438/701 |
| 6,033,928 | A |   | 3/2000  | Eriguchi et al. |
| 6,143,628 | A | * | 11/2000 | Sato et al. ............... 438/455 |

(Continued)

FOREIGN PATENT DOCUMENTS

DE  100 131 249 A  5/2002

(Continued)

OTHER PUBLICATIONS

European Search Report for 02425742.0 dated Aug. 6, 2003.

(Continued)

*Primary Examiner*—Leonardo Andújar
*Assistant Examiner*—Monica D Harrison
(74) *Attorney, Agent, or Firm*—Lisa K. Jorgenson; Paul F. Rusyn; Graybeal Jackson LLP

(57) ABSTRACT

A method for manufacturing a semiconductor substrate of a first concentration type is described, which comprises at least a buried insulating cavity, comprising the following steps:
 forming on the semiconductor substrate a plurality of trenches,
 forming a surface layer on the semiconductor substrate in order to close superficially the plurality of trenches forming in the meantime at least a buried cavity in correspondence with the surface-distal end of the trenches.

22 Claims, 26 Drawing Sheets

U.S. PATENT DOCUMENTS

| | | | |
|---|---|---|---|
| 6,670,257 B1 * | 12/2003 | Barlocchi et al. | ........... 438/422 |
| 7,193,256 B2 | 3/2007 | Renna et al. | |
| 2002/0070419 A1 | 6/2002 | Farrar et al. | |
| 2002/0076896 A1 | 6/2002 | Farrar et al. | |
| 2004/0142542 A1 | 7/2004 | Murphy et al. | |

FOREIGN PATENT DOCUMENTS

| | | |
|---|---|---|
| DE | 10131249 A1 | 6/2009 |
| EP | 1 073 112 A | 1/2001 |
| EP | 1 113 492 A | 7/2001 |

OTHER PUBLICATIONS

Tsunashima, et al. "A New Substrate Engineering Technique to Realize Silicon on Nothing" Electrochemical Society Proceedings, Electrochemical Society, Pennington, NJ, US, No. 17, 2000, pp. 532-545, XP008004134 ISSN: 0161-6374.

Sato, et al. "SON (silicon on nothing) MOSFET Using ESS (empty space in silicon) Technique for SoC Applications" International Electron Devices Meeting 2001. IEDM. Technical Digest. Washington, DC, Dec. 2-5, 2001, New York, NY: IEEE, U.S., Dec. 2, 2001, pp. 3771-3774, XP010575245 ISBN: 0-7803-7050-3.

* cited by examiner

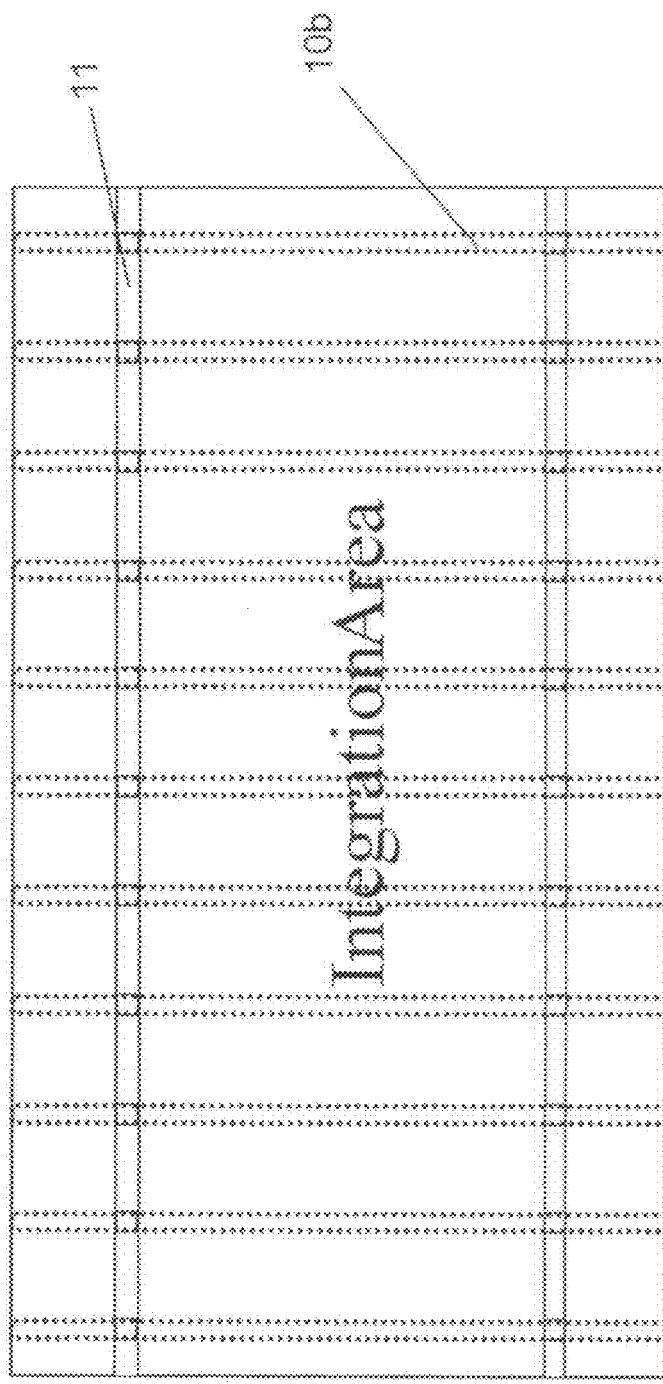

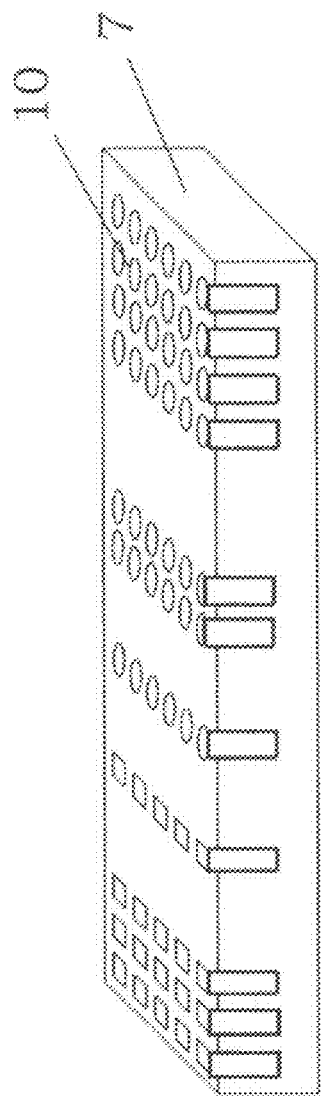
FIG. 23
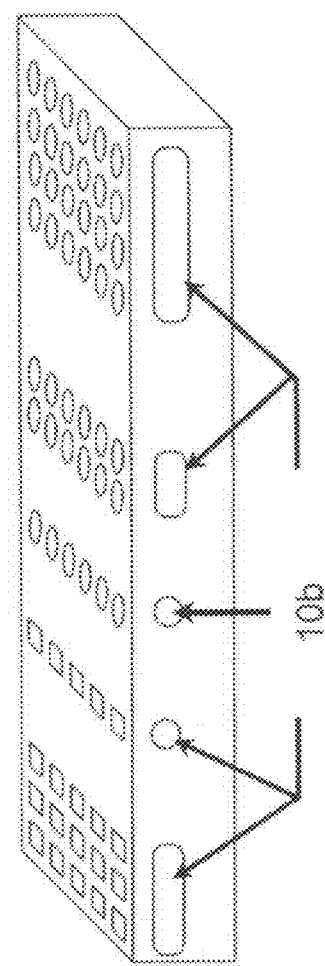
FIG. 24
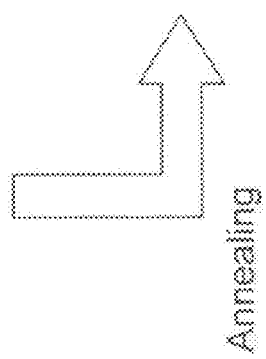
Annealing

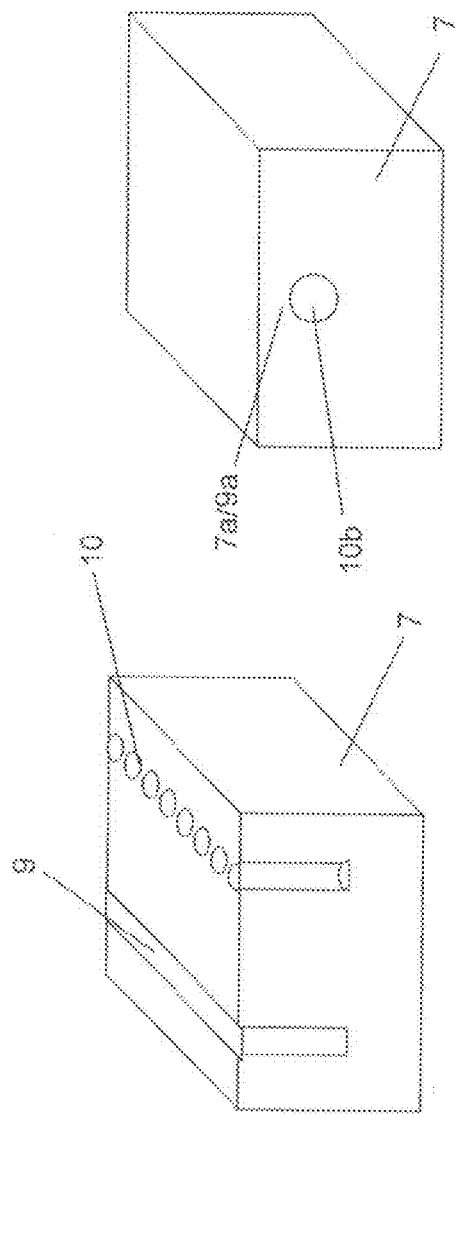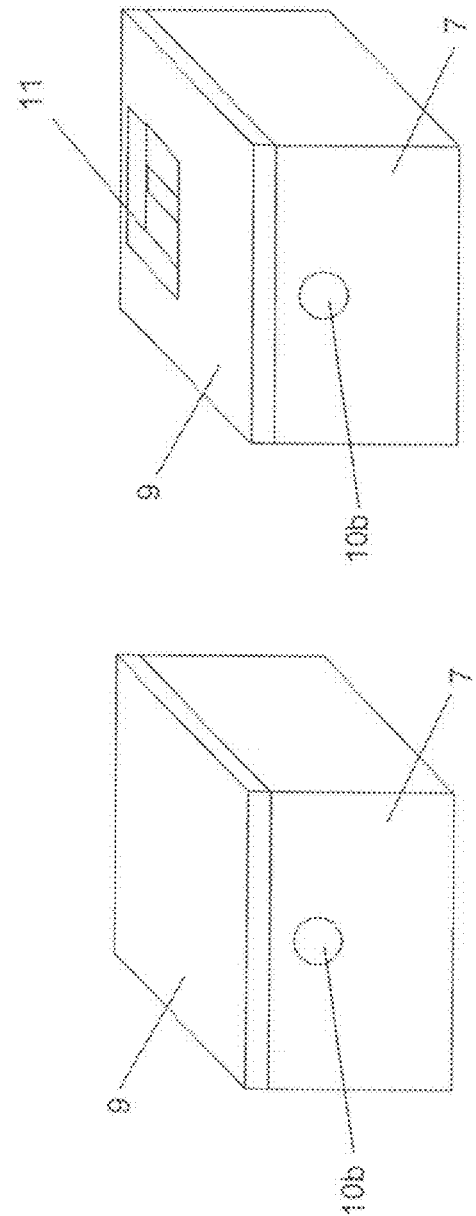
FIG. 26A  FIG. 26B  FIG. 26C  FIG. 26D

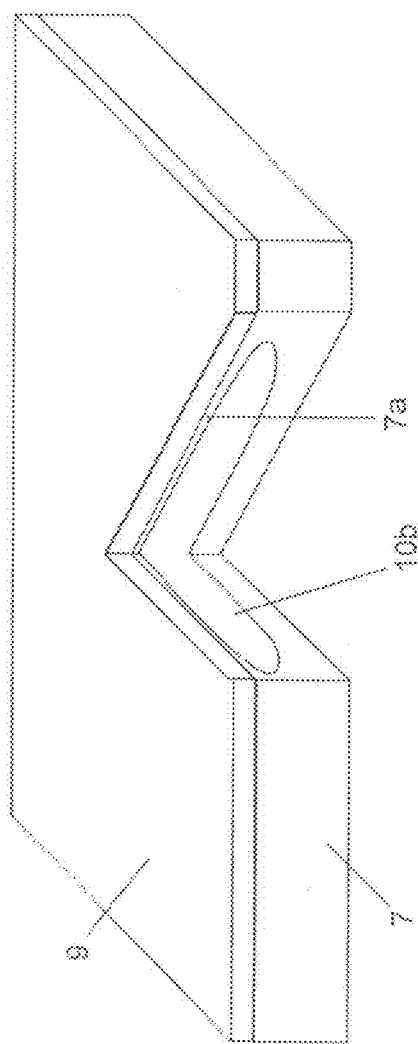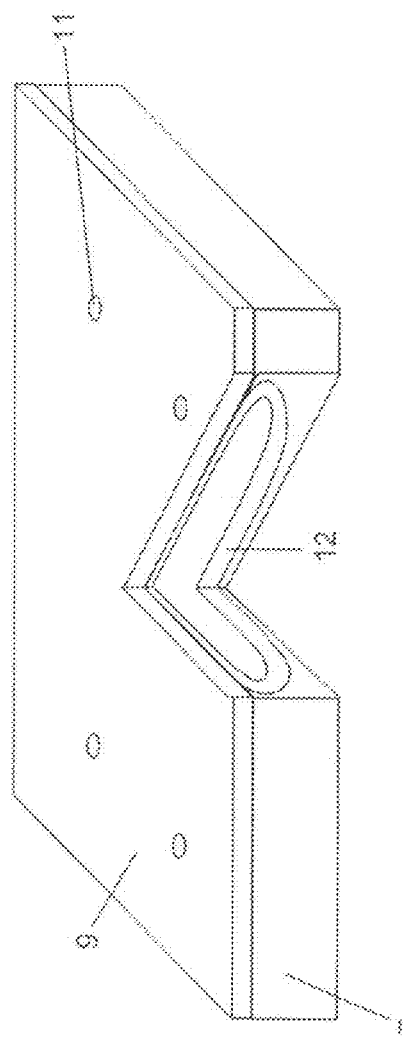

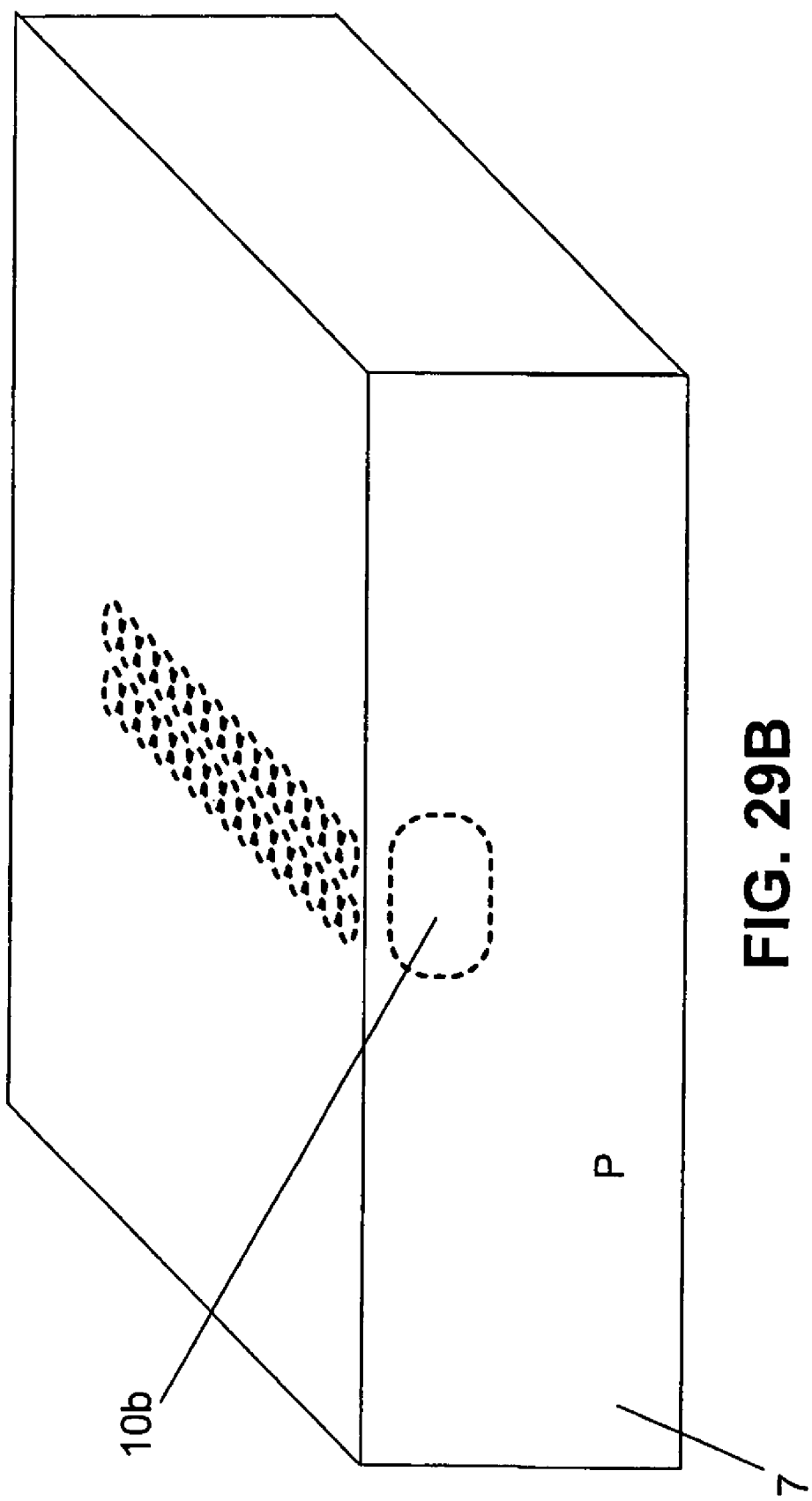

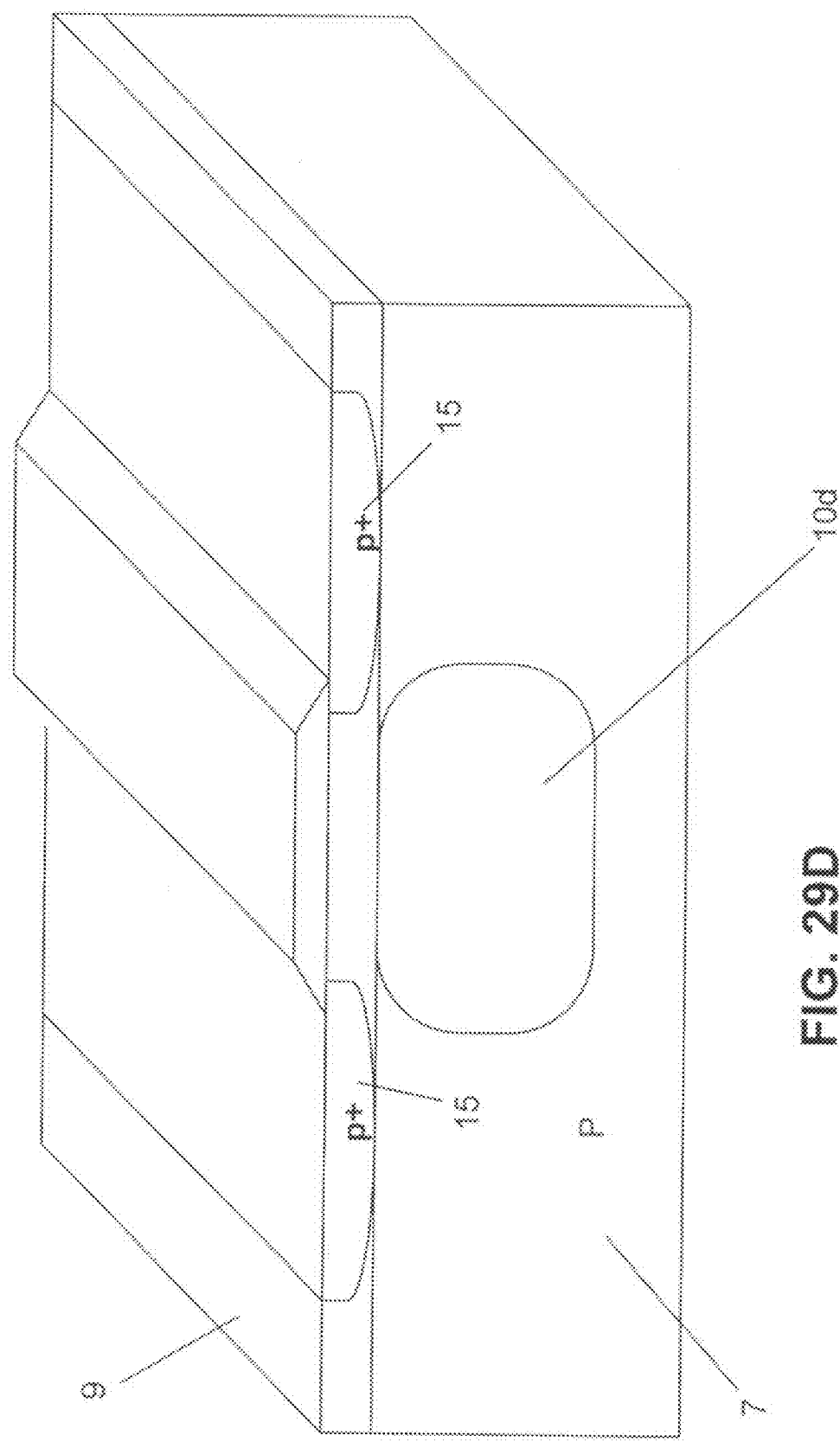

MANUFACTURING METHOD FOR A SEMICONDUCTOR SUBSTRATE COMPRISING AT LEAST A BURIED CAVITY AND DEVICES FORMED WITH THIS METHOD

PRIORITY CLAIM

This application is a Divisional of U.S. patent application Ser. No. 10/726,005, filed on Dec. 1, 2003 now U.S. Pat. No. 7,193,256 which claims priority from European patent application No. 02425742.0, filed Nov. 29, 2002, which is incorporated herein by reference.

TECHNICAL FIELD

Embodiments of the present invention relate generally to a method for manufacturing a semiconductor substrate comprising at least a buried cavity.

More specifically, embodiments of the invention relate to a method for manufacturing a semiconductor substrate of a first concentration type comprising a buried insulating cavity.

Embodiments of the invention also relate to devices manufactured with a method according to the embodiments of the invention.

Embodiments of the invention relate particularly, but not exclusively, to a method for manufacturing a semiconductor substrate comprising buried microchannels and the following description is made with reference to this field of application for convenience of illustration only.

BACKGROUND

As it is well known, demands for circuits with higher operating speeds, affecting at present most electronic applications, particularly at radio frequency, and the need to produce chip integrated mechanical structures (MEMS-Micro Electro-Mechanical System), make the use of SOI (Semiconductor On Insulator) substrates more and more frequent. In fact, most of the limitations of electronic-circuit performance are due to the dispersion and parasitic effects occurring between the integrated devices and the substrate.

A first prior-art solution to insulate the semiconductor integrated electronic devices from the substrate provides for the creation under said devices of highly doped "buried" wells, which form charge-depletion areas in order to block the charge flow towards the substrate.

Although advantageous in many aspects, this first solution has several drawbacks. In fact, with the increase of circuit operating frequencies, this solution cannot meet the insulation requirements needed for the correct operation of the single devices.

As already mentioned, a second solution provides, on the contrary, the use of SOI substrates, whose structure is shown in FIG. 1.

In particular, a SOI structure comprises a first substrate 1 and a second substrate 2 insulated from each other by an oxide layer 3. Such a structure allows the first substrate 1, whereon all devices are integrated, to be electrically insulated from the second substrate 2.

It is evident that the dispersion currents between the first and second substrates are almost null, and the parasitic capacitance effects are reduced, allowing, therefore, the integration of devices operating at higher cut-off frequencies than typically possible in a non-SOI structure.

As already said, SOI structures are used considerably also in MEMS and MOEMS (Micro Optical-Electro-Mechanical System) applications to form suspended structures, because it is possible to selectively remove the buried oxide layer since it is used as sacrificial layer.

Nevertheless, the formation of SOI structures is rather expensive, and it heavily affects the calculation of the final cost of the finished product. Moreover, these manufacturing processes are rather critical and often involve a significant decrease in yield, both because of structural defects and because of the effective reduction in useable area.

The main process steps of a traditional SOI structure manufacturing process are now described.

A first and second substrate 1 and 2 are superficially oxidized, so that the thickness of the oxide layer 3 thus obtained on the surface of the two substrates 1 and 2 is about half the thickness of the final layer 3 as shown in FIG. 2.

After performing a polishing step of the surfaces which will come into contact, the first and second substrates 1 and 2 are initially aligned with micrometric precision, and are then put in surface contact. By means of a pressure exerted by a body B, in order to eliminate the air between the oxide layers 3 belonging to two substrates 1 and 2, a virtually perfect adhesion is obtained as shown in FIG. 3.

The first and second substrates 1 and 2 are then subjected to a thermal process at high temperature (e.g., $1100 \div 1200°$ C.) which allows the oxide layer 3 to reflux and then bond of the two substrates (FIG. 4).

The SOI structure thus obtained is superficially refaced and polished in order to obtain the surface ready for the integration of the electronic devices. The thickness of the first substrate is set at a chosen value, which varies according to the applications used as shown in FIG. 5.

Although the process can seem simple, the high cost of the single SOI structure is, however, due to the low yield. In fact, in order to make the SOI structure usable, the alignment of the two substrates 1 and 2 must be practically perfect, with the ideal being to keep the crystallographic orientation of the substrates 1 and 2 the same in the SOI structure.

Moreover the thermal processes create a series of stress phenomena which produce the so-called "warp" effect. This effect causes a bending of the SOI structure because of a bending-radius decrease by more than one order of magnitude. This "warp" effect is even higher if the oxide layer 3 on the back side of the substrate 2 facing away from the substrate 1, of the SOI structure is removed, because this layer balances at least partially the "warp" effect induced on the SOI structure by the oxide layer 3 on the first substrate 1. The removal of this back oxide layer 3 is quite common in most devices having a back contact. In some SOI structures, the bending is so high as to create problems in the photolithography both in the alignment step and in the focusing step. Moreover, in some cases, the "warp" effect of the SOI structure does not allow the vacuum system that holds the SOI structure in place to seal.

It is therefore expensive from the economic point of view to manufacture SOI structures characterized by close tolerances from the point of view of thickness, uniformity, and "warp" effect. Moreover the external circular oxide crown called the "terrace" must be taken into consideration for each SOI structure, because it reduces, by more than 1 cm, the diameter of the area effectively usable for the integration. Also, the terrace negatively affects the wafer yield, greatly on small and middle-sized substrates (4, 5 and 6 inches), and in a more limited way on large-sized substrates (8 and 12 inches).

A second method to form higher-quality substrates, but also more expensive, exploits the so-called SIMOX method, whose main steps are indicated herebelow.

With particular reference to FIGS. 6 to 9, a semiconductor substrate 4 is shown, which is implanted with high-energy and high-dose oxygen ions. The implanted layer 5 which is formed is positioned at about 1 μm from the surface.

An annealing is then performed at extremely high temperature in an inert atmosphere for the diffusion of the implanted ions and the restoration of the crystalline characteristics of the semiconductor substrate above the layer 5 damaged by ion implantation, with subsequent extension of the area which will become the SOI structure oxide layer.

A further annealing step at extremely high temperature in an oxidizing atmosphere is performed to realize the oxidation of the buried layer 5 and complete the SOI substrate structure oxide layer 5'.

The surface oxide layer 6 is then removed to complete the definite SOI structure.

Although the SIMOX method allows improved substrates to be obtained, from the physical-mechanical characteristic point of view, this process is, as already mentioned, rather expensive. Moreover, limitations exist on the achievable thickness; for example, the thickness of the buried oxide layer typically does not exceed 500 nm, and the thickness of the overall SOI structure typically does not exceed one micron.

If compared to the first method for manufacturing a SOI structure, this last method allows an improved thickness tolerance, a greater uniformity, the absence of the terrace and, thus, a larger exposable surface for the same wafer size, and finally the so-formed SOI structures are less affected by the "warp" effect.

Therefore, a need has arisen for a structure comprising a low-cost buried insulation layer capable of providing good physical-mechanical characteristics and a wide thickness choice of the buried oxide layer and of the final structure, overcoming the limitations and drawbacks which still limit the SOI structures formed according to the prior art.

SUMMARY

An embodiment of the present invention provides a cavity in a semiconductor substrate starting from trench structures formed therein by exploiting the properties of the silicon self-organizing surface migration process.

BRIEF DESCRIPTION OF THE DRAWINGS

Features and advantages of the device according to the invention will be apparent from the following description of an embodiment thereof given by way of non-limiting example with reference to the attached drawings.

In the drawings:

FIGS. 1 to 5 are respective schematic-section views of a semiconductor substrate portion during the steps of a first method for manufacturing SOI structures according to the prior art;

FIG. 21 is a top view of a semiconductor substrate according to an embodiment of the invention;

FIGS. 23 and 24 show possible geometries of cavities which can be obtained from differently-located trenches according to an embodiment of the invention;

FIGS. 26a to 26f are respective schematic views of a first embodiment of the manufacturing method according to embodiments the invention;

FIGS. 27a to 27g are respective schematic views of a second embodiment of the manufacturing method according to embodiments of the invention;

FIGS. 29a to 29e are respective schematic views of a fourth embodiment of the manufacturing method according to embodiments of the invention.

DETAILED DESCRIPTION

With reference to the drawings, a method for manufacturing SOI structures according to an embodiment of the invention is now described.

Figure 2:
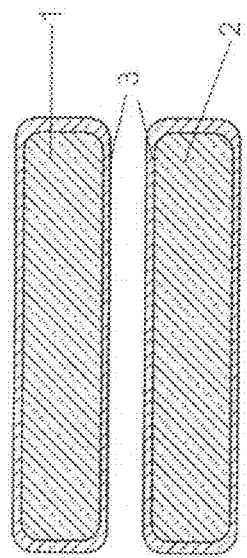
Figure 4:
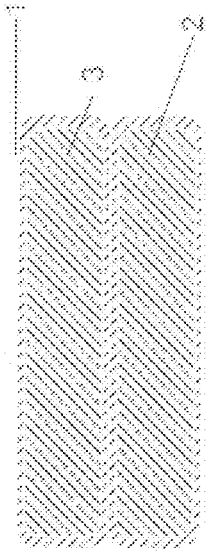
Figure 6:
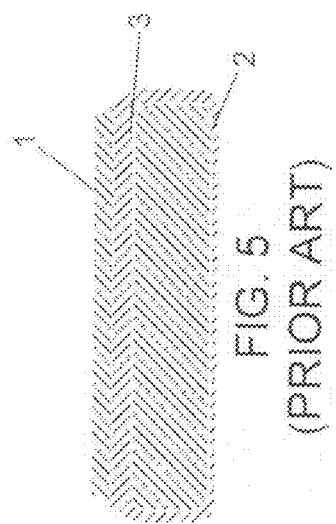
FIGS. 6 to 9 are respective schematic-section views of a semiconductor substrate portion during the steps of a second method for manufacturing SOI structures according to the prior art.
Figure 1:
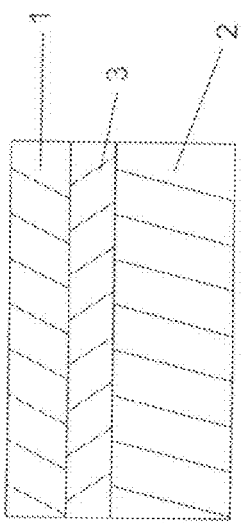
Figure 3:
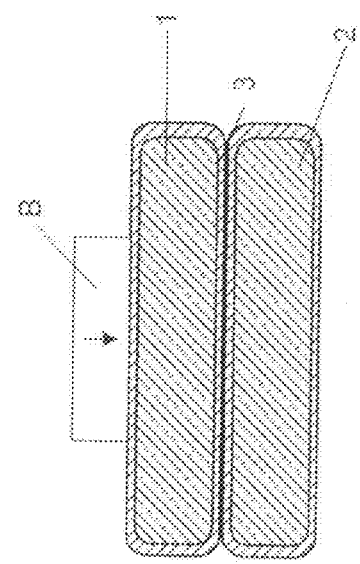
Figure 6:
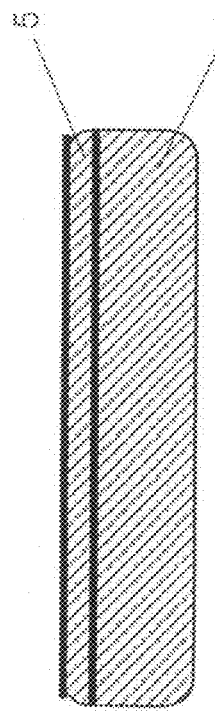
Figure 7:
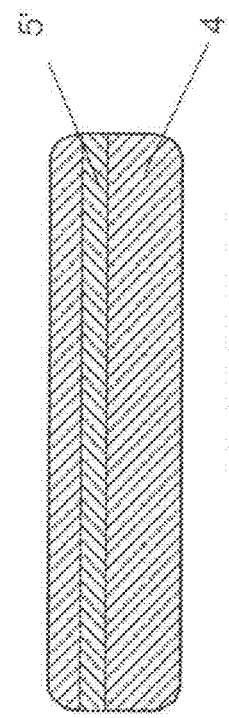
Figure 8:
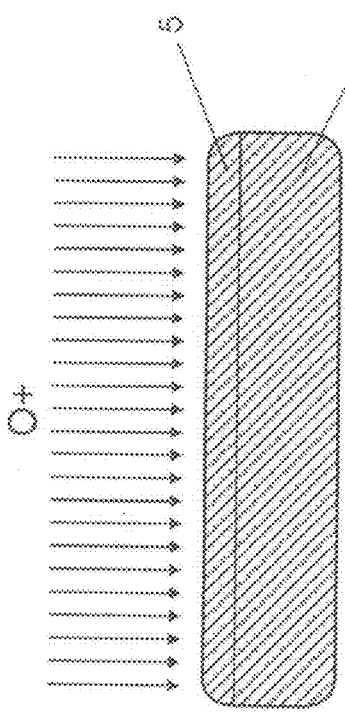
Figure 9:
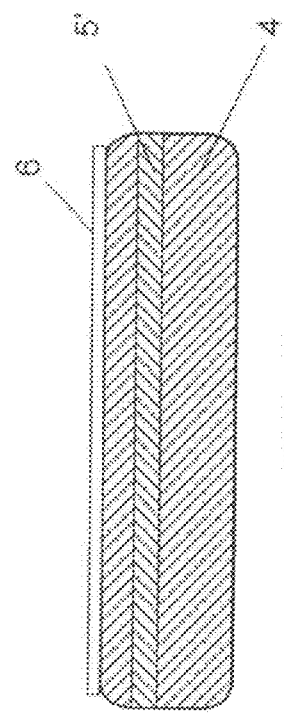
Figure 10:
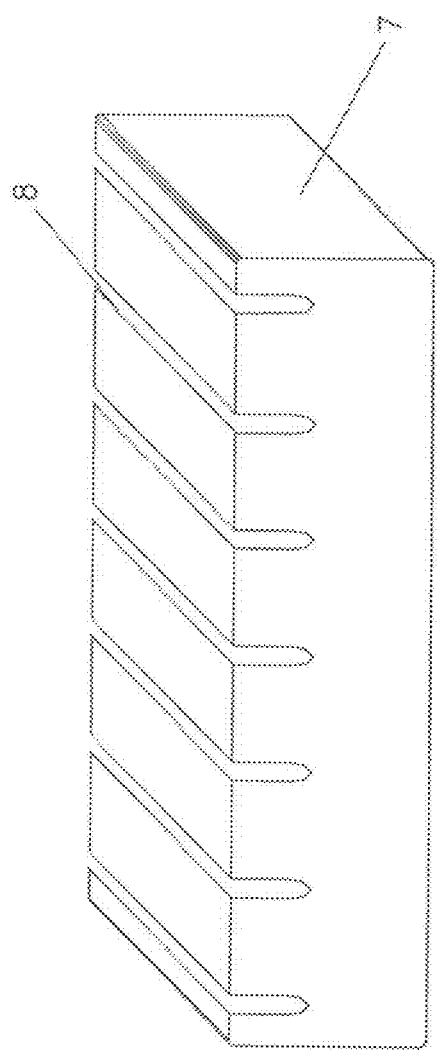
FIGS. 10 to 16 are respective schematic views of a semiconductor substrate portion during the steps of a method for manufacturing SOI structures according to an embodiment of the invention.

In particular, as shown in FIG. 10, through a traditional photolithographic technique, several trenches 8 are formed in a semiconductor substrate 7.

The semiconductor substrate 7 is formed by a crystalline silicon wafer with any P-type crystallographic orientation, for example doped with acceptor ions with a concentration between 1E13 and 5E20 [cm$^{-3}$] (P$^-$, P, P$^+$, P$^{++}$ type etc.). In alternative, the semiconductor substrate 7 is doped with donor ions (N-type) with a concentration between, for example, 1E13 and 5E20.

If the substrate 7 is of the N$^-$ type, an N$^+$-type epitaxial layer is formed on the substrate 7. The so-formed epitaxial layer thickness can vary by several microns, according to the chosen application type.

In a first embodiment, the trenches 8 are equally-spaced grooves formed in the substrate 7, for example, having a width between 0.3 and 5 μm, a depth between 1 and 40 μm, and having a distance between adjacent trenches of between 10 and 40 μm.

Figure 12:
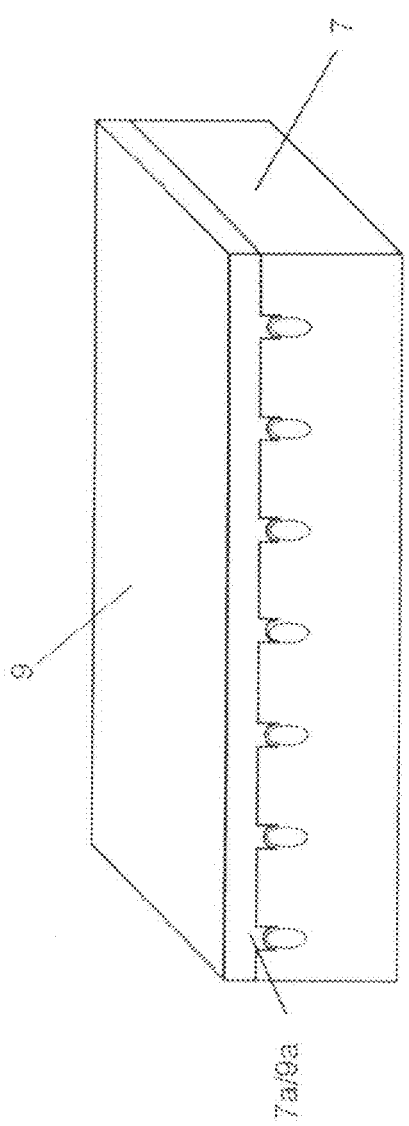

As shown in FIG. 12, after the trench 8 formation a semiconductor material layer 9 is formed on the substrate 7 surface. This semiconductor material layer 9 is formed in order not to completely close trenches 8, so as to create a planar surface layer.

This semiconductor material layer 9 is formed for example with epitaxy.

The semiconductor material layer 9 is of the same dopant type and with the same impurity concentration as the substrate 7 (relative to the P-type substrate 7 case) or as the first epitaxial layer being formed (in the case of the N⁻-type substrate). The thickness of this semiconductor material layer 9 is, for example, between 1 and 10 μm.

In order to partially close trenches 8 the silicon self-organizing surface migration process can be also exploited.

Figure 11:
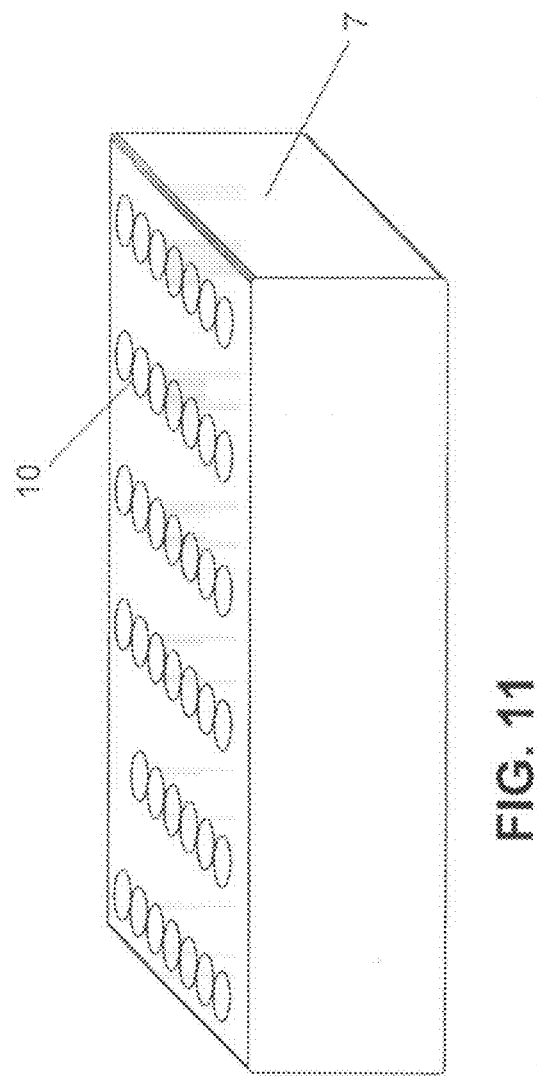

Particularly, cylindrically developing trenches 10 are formed in the substrate 7, which have a diameter comprised, for example, between 0.2 and 2 μm and a depth comprised between 2 and 30 μm, as shown in FIG. 11.

It is however possible to form trenches 8 developing in parallel lines, as shown for example in FIG. 10.

After forming trenches 10 in the substrate, an annealing process is performed at high temperature, for example between 1000° C.÷1300° C., in a non-oxidizing environment, for example H2, for about some tens of minutes.

A structural rearrangement of atoms towards the lowest energy layers occurs in the substrate 7, so that the cylindrically-developing trench 10 turns into a spherical cavity 10a buried in correspondence with the surface-distal trench and forming a surface layer 7a on the cavities.

Particularly, the annealing thermal process changes the morphology of trenches 10 as shown in FIGS. 17a to 17f.

This silicon self-organizing surface migration process has also some advantages with respect to the traditional methods for manufacturing SOI structures, in fact it does not produce defects in the upper crystalline structure.

If very close trenches 10 are formed in the substrate 7, it is possible to form the structure shown in FIGS. 18a to 18d wherein the cylindrically developing trenches 10 turn at first into essentially skittle-shaped cavities to become afterwards spherical cavities 10a joining the adjacent cavities, forming thus a sole area or microchannel 10b.

Experimental tests have shown that, with $R_s$ indicating the radius of the depleted sphere 10a produced at the end of the annealing process by the trench 10, and $R_R$ indicating the radius of the starting trench 10, having cylindrical symmetry, it results:

$$R_s = 1.88 R_R$$

Figure 20:
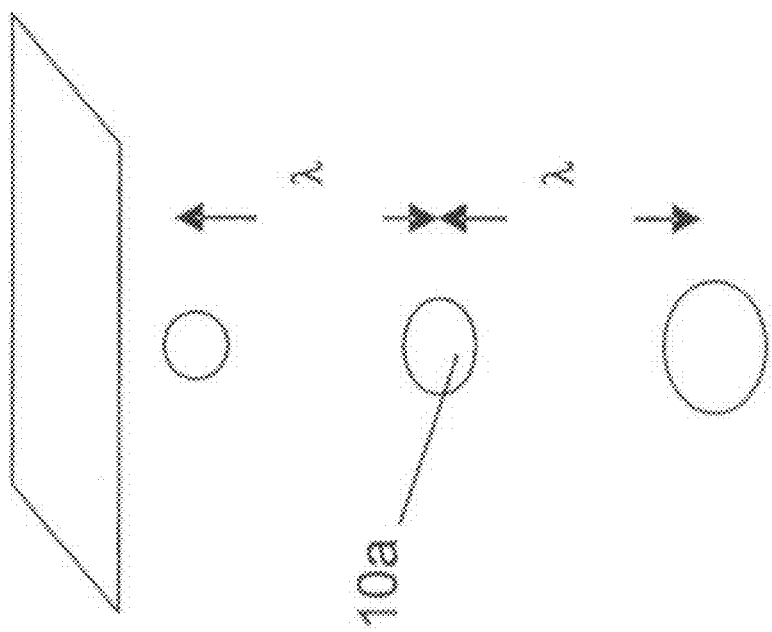
FIGS. 19 and 20 are respective schematic views of a trench formed in a semiconductor substrate during the steps of a manufacturing method according to an embodiment of the invention.
Figure 19:
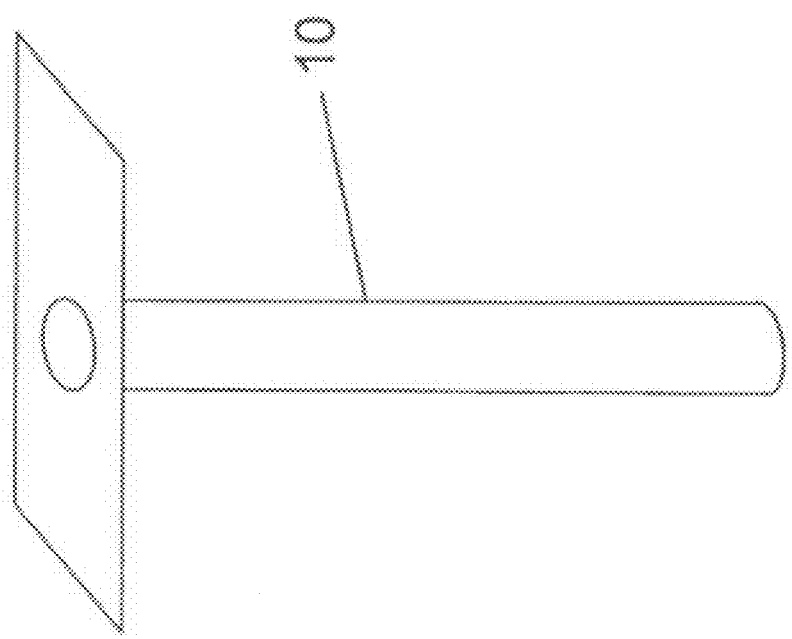

As shown in FIG. 19, if the trench 10 is very deep with respect to its width, the self-aggregation process forms different vertically-aligned spheres 10a, and λ being the distance between two spheres 10a formed inside the same trench 10, the result is that λ is equal to 8.89 $R_R$, as shown in FIG. 20.

Figure 22:
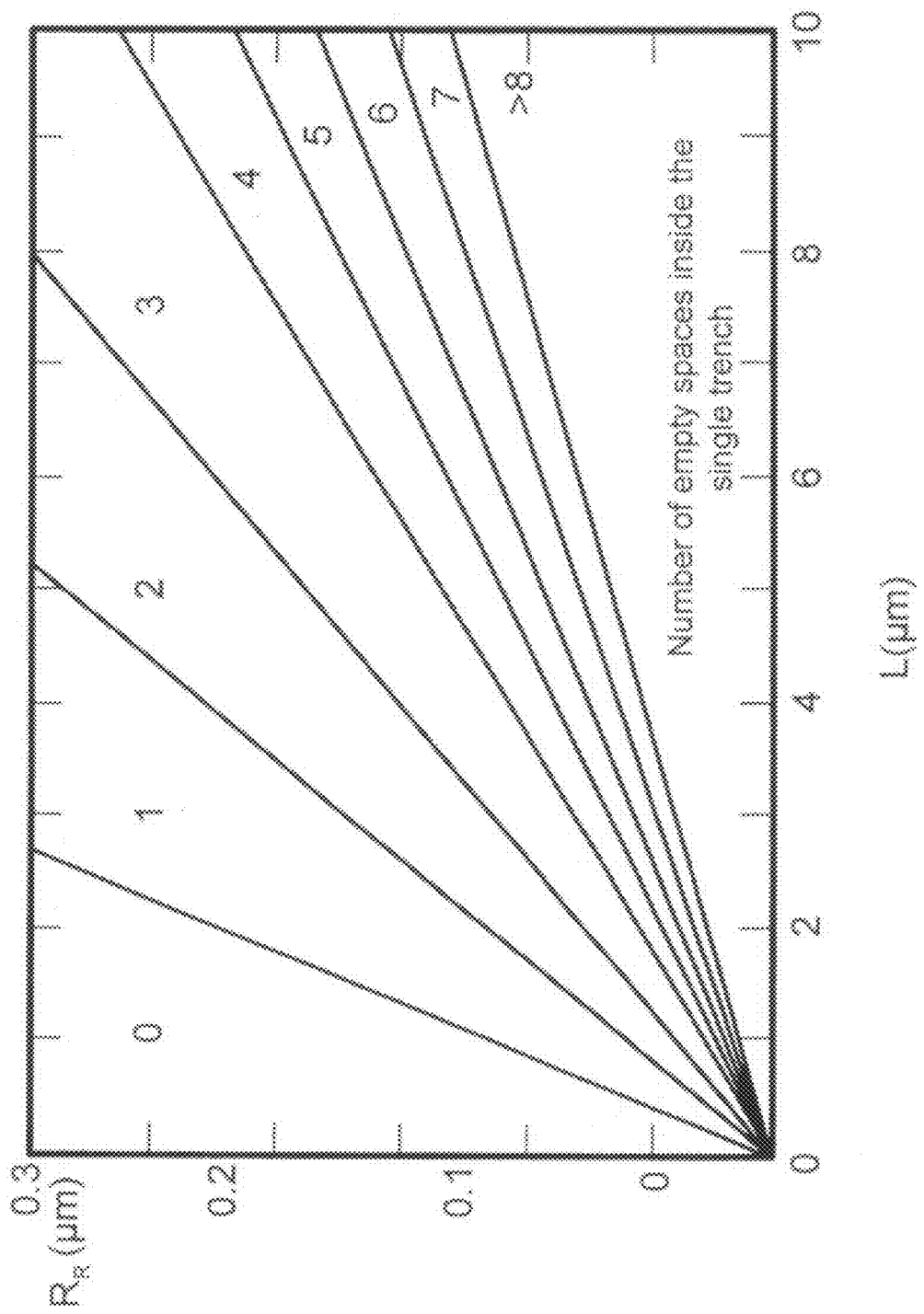
FIG. 22 shows, according to the depth L and the radius R of trenches formed in the substrate, the number of void spheres formed in the semiconductor layer in consequence of the silicon self-organizing surface migration process according to an embodiment of the invention.

The number of depleted spheres 10a formed inside the semiconductor layer 7 is highlighted, depending on the depth L and the radius R of the trench 10, in the diagram of FIG. 22.

By changing the depth L of the trench 10, it is possible to determine the number and the radius of the depleted areas formed after the silicon self-organizing surface migration process inside the single trench 10.

Advantageously, by forming the trenches 10 in such a way that the distance $D_{NT}$ between the centers of two consecutive trenches is equal to $2R_S = 3.76 R_R$, each depleted sphere 10a being formed can thus join the first sphere close thereto. In this way an infinite number of depleted spheres 10a can be connected obtaining several geometries as shown in FIGS. 23 and 24. The quantity $D_{NT}$ is typical of the process as far as the microchannel 10 size and the thickness of the buried depleted layer are concerned, and it is linked to these parameters by the equation:

$$R_P = (8.86 R_R^3 / D_{NT})^{1/2}$$

Once the trench 8 or 10 closing process is completed, through the deposition of the surface layer 9a or the annealing process, the SOI structure manufacturing process continues, however, with the formation on the surface layer 7a, 9a of the semiconductor material layer 9 which forms the final SOI structure final substrate layer.

The type of doping and the concentration of this semiconductor material layer 9 are conveniently selected on the basis of the application.

If the starting substrate 7 is of the N-type, the N-type epitaxial layer exists between this semiconductor material layer 9 and the microchannels.

Figure 13:
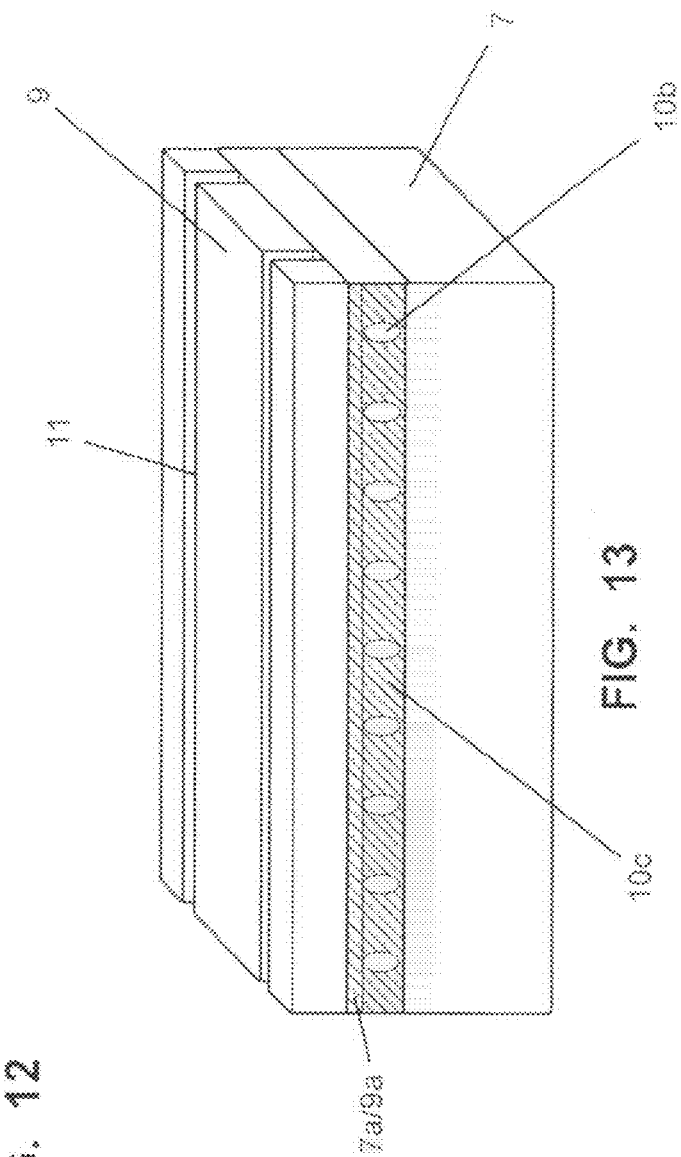

As shown in FIG. 13, a series of trenches 11 being orthogonal to the first series of trenches 8 or microchannels 10b is formed in the semiconductor material layer 9. These trenches 11 are so deep as to intersect microchannels 10b.

The distance between these orthogonal trenches 11 depends on the size of the device, or of the circuit, which is to be integrated on the SOI structure (even several mms).

The structure thus obtained is subjected to a step of transforming of a layer 10c comprising microchannels 10b into a porous silicon layer. Particularly, the structure is subjected to a wet electroerosive process of the crystalline silicon in a hydrofluoric acid water solution. Therefore the layer 10c comprising microchannels 10b turns into a porous silicon layer 12.

The electrochemical process occurs in a cell wherein the crystalline silicon layer 10c is the positive electrode, while the cathode is a metallic electrode.

Particularly, once an operating voltage is set, porous silicon is not formed in the N⁻ type layers, because it is as if a reverse-biased junction preventing the current flow was formed. Vice versa, in the P⁺, N⁺ and P⁻ type substrate portion, with the same voltage, porous silicon is formed, since it is as if a directly biased junction allowing the current to flow is formed, closing the electric circuit being created. Nothing prevents operating selectively between areas P⁺ and N⁺, it is simply enough to correctly define the process parameters.

Figure 25:
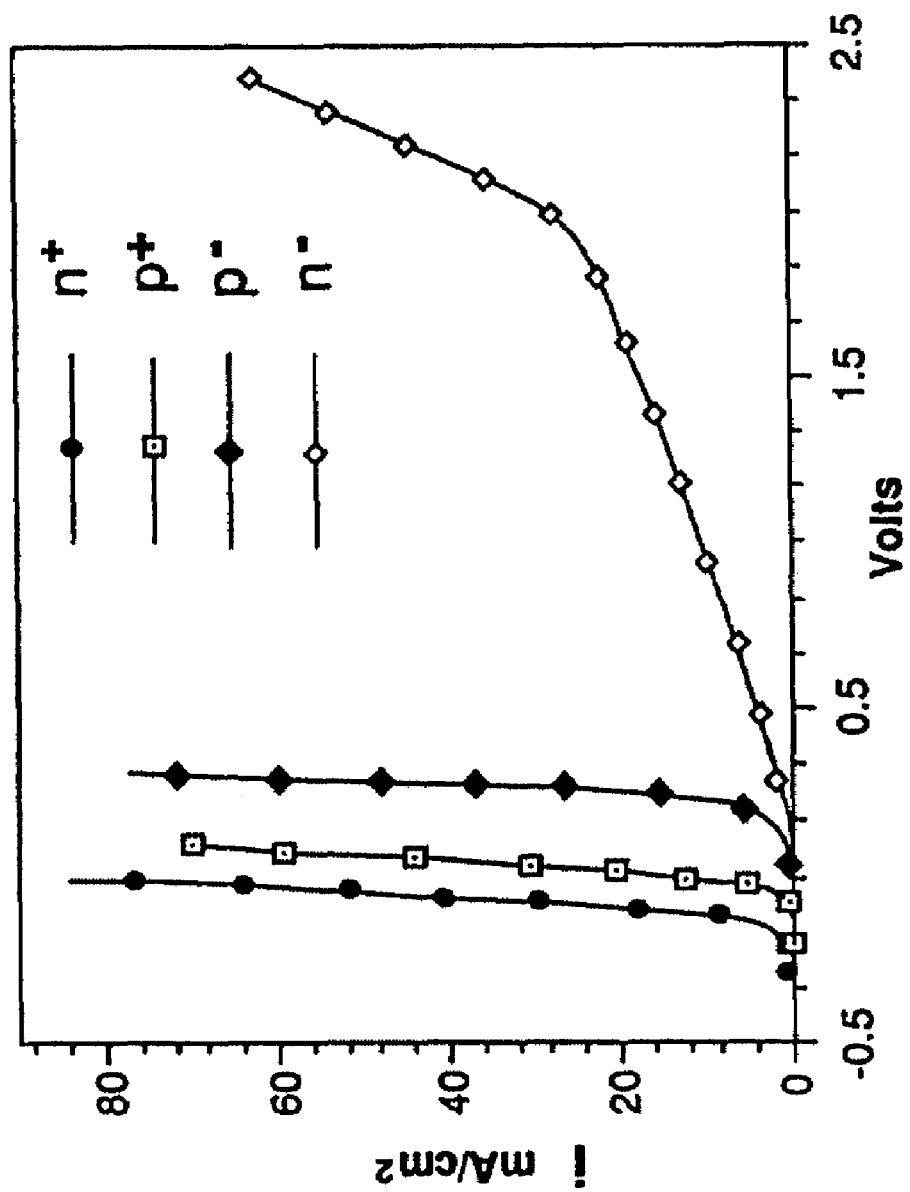
FIG. 25 shows a curve of the feature voltage v. current according to the semiconductor substrate doping concentration and type during the transformation step of the crystalline silicon into porous silicon according to an embodiment of the invention.

The diagram of FIG. 25 shows a curve of the characteristic voltage v. current depending on the doping concentration and type, which explains the selectivity phenomenon of the porous silicon formation process.

Figure 14:
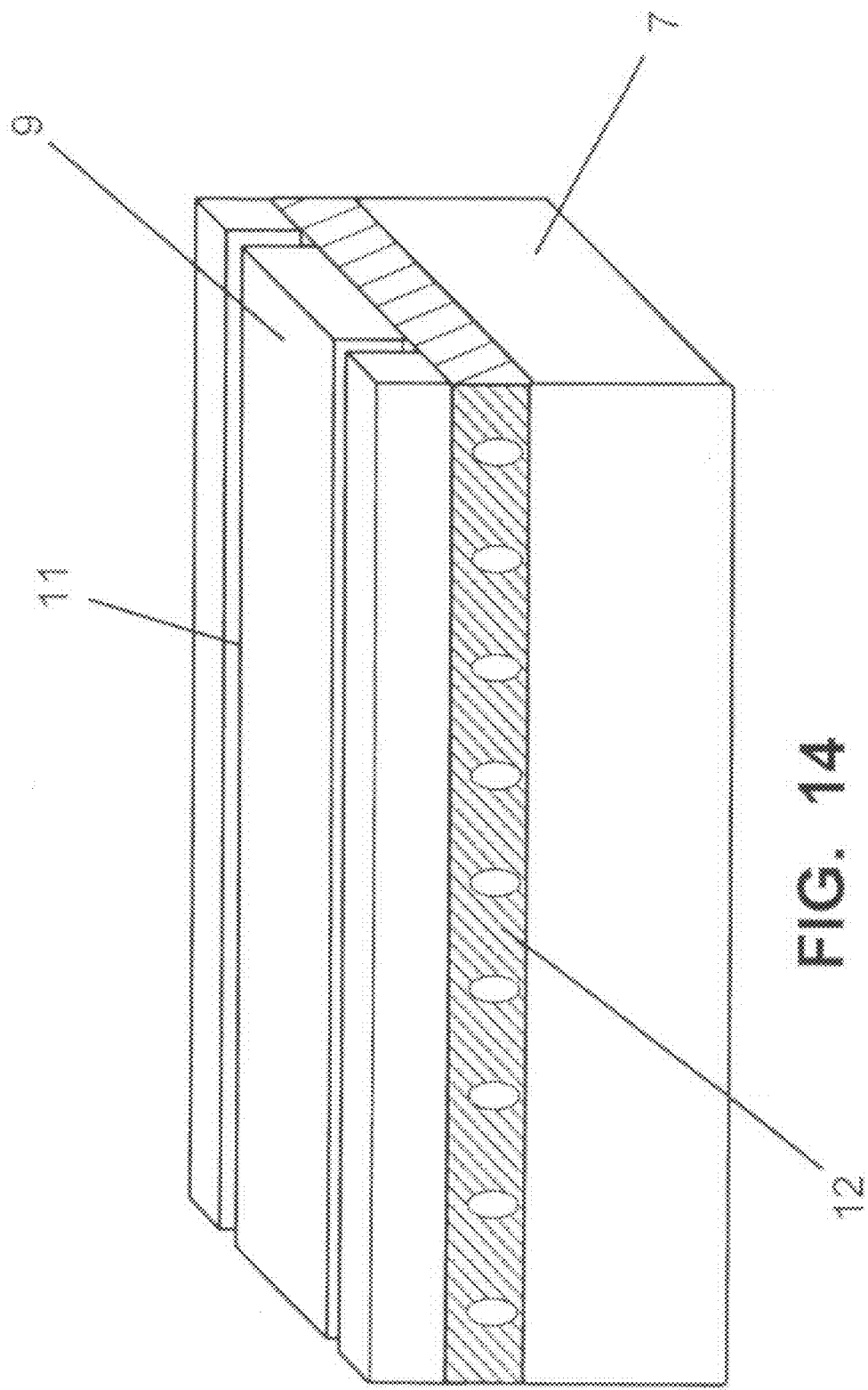

After the electrochemical etching, the structure obtained therefrom is the same as in FIG. 14 wherein the N⁺ type silicon layer 10c in which microchannels 10b are formed turns into a porous silicon layer 12.

The structure obtained comprises therefore, on a crystalline silicon substrate 7, a porous silicon layer 12 crossed by a series of equally-spaced microchannels 10b, whereon a semiconductor material layer 9 is formed on which it is possible to perform the integration of devices and circuits. The semiconductor material layer 9 is crossed by a series of trenches 11 being orthogonal to the microchannels 10b which, through their intersection, create a network of channels allowing the electrochemical solution to permeate during the electroerosion process, and the output of reaction products of the process for forming porous silicon. Afterwards the same channels 11 will serve to carry the gas required for the oxidation, or the thermal treatment of the porous silicon layer 12.

A scheme of the structure obtained seen from above is the one shown hereafter in FIG. 21.

Figure 15:
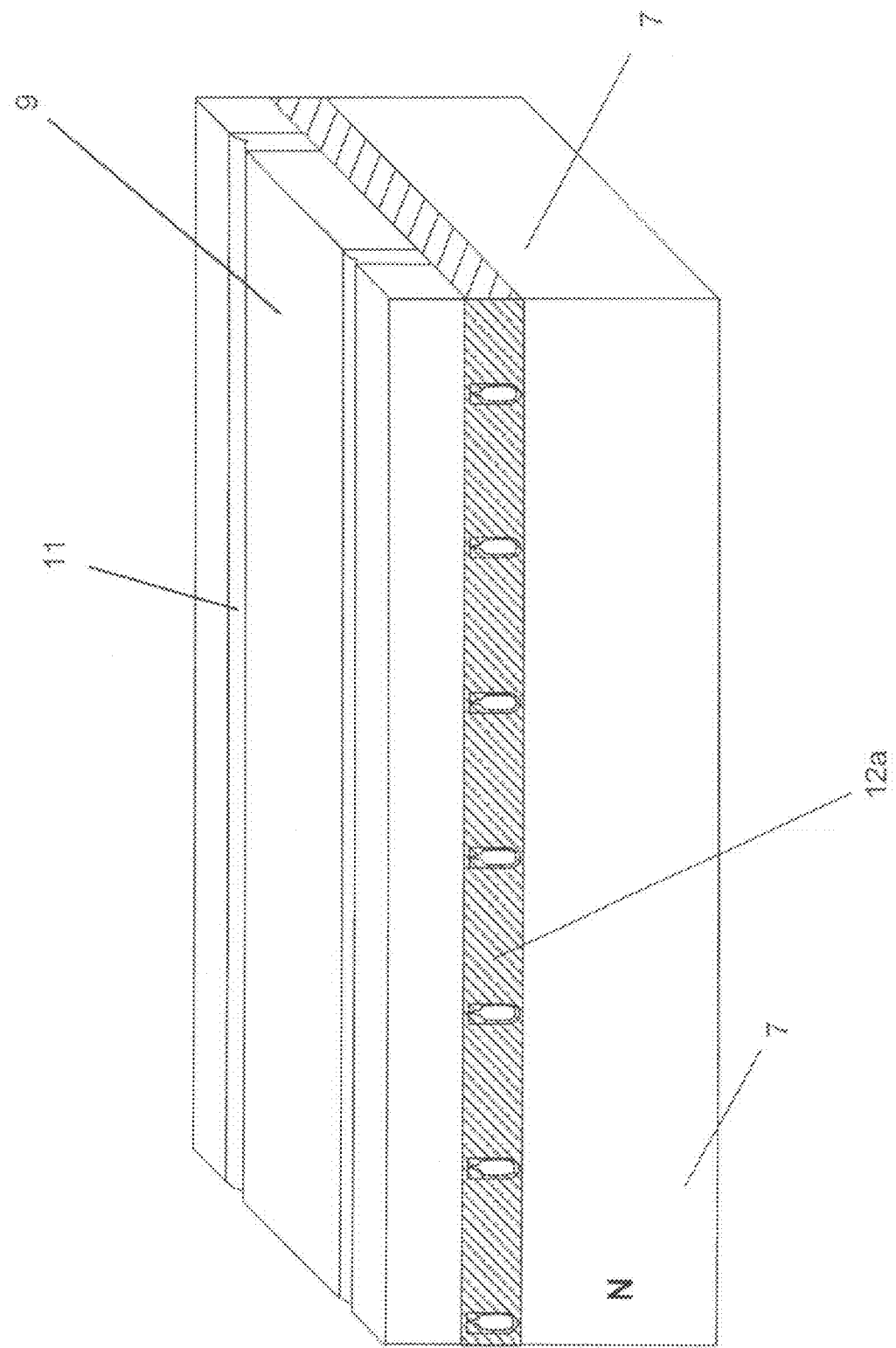
Figure 16:
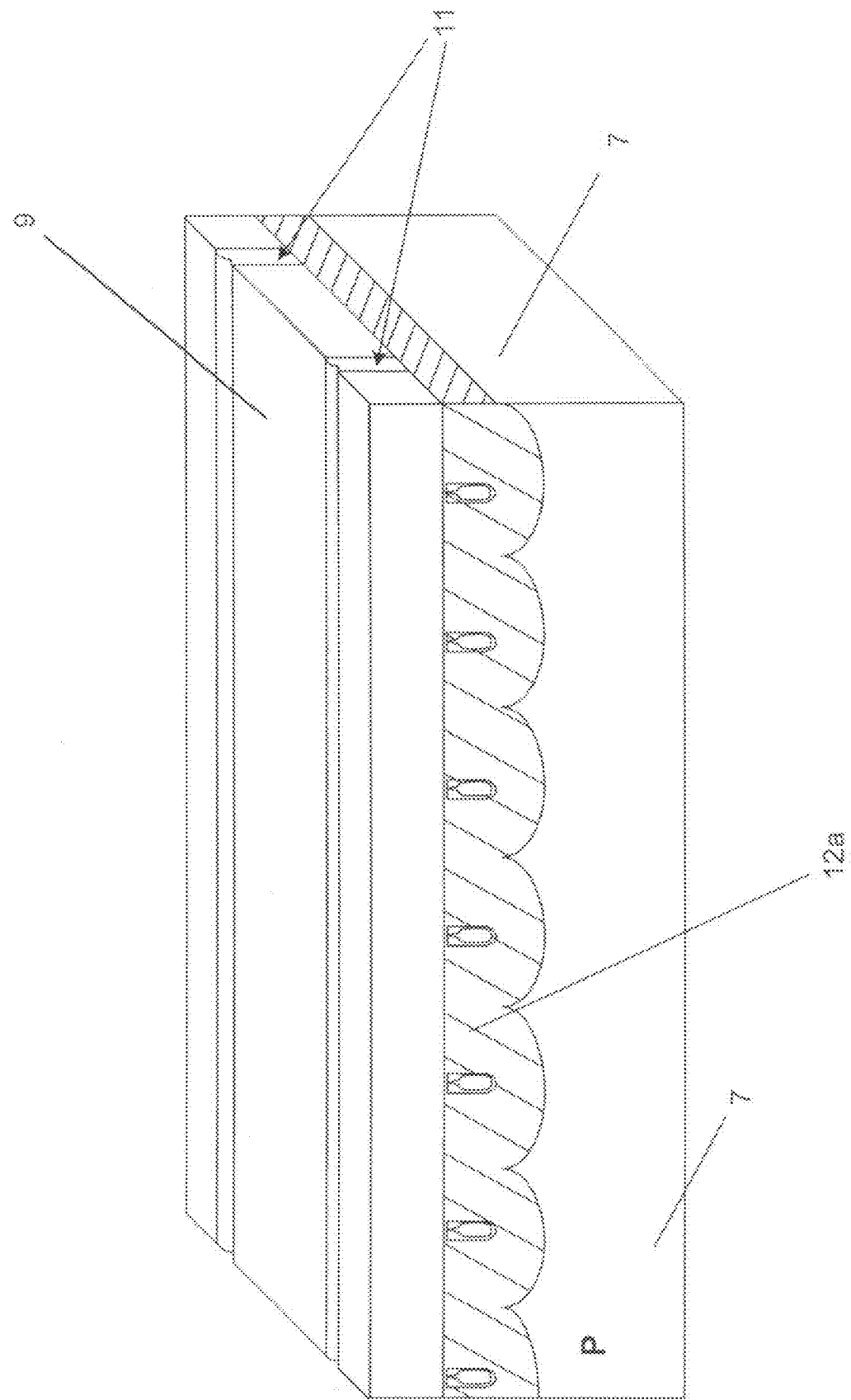
Figure 17A:
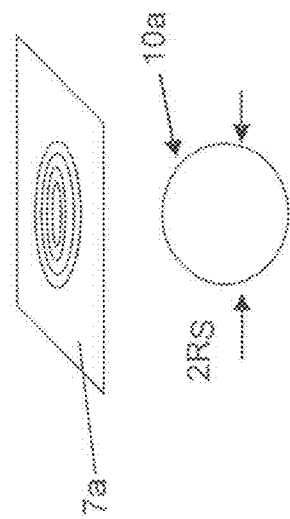
FIGS. 17a to 17f are respective schematic views of a trench formed in a semiconductor substrate during the steps of a manufacturing method according to an embodiment of the invention.
Figure 17B:
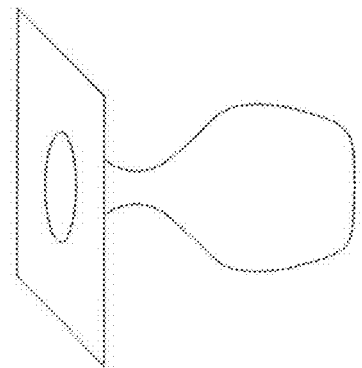
Figure 17C:
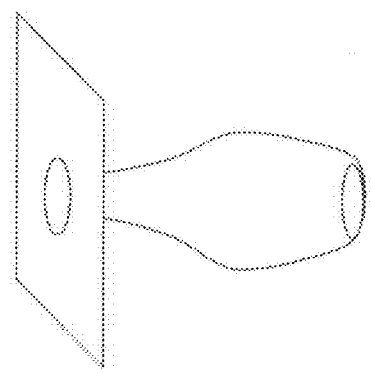
Figure 17D:
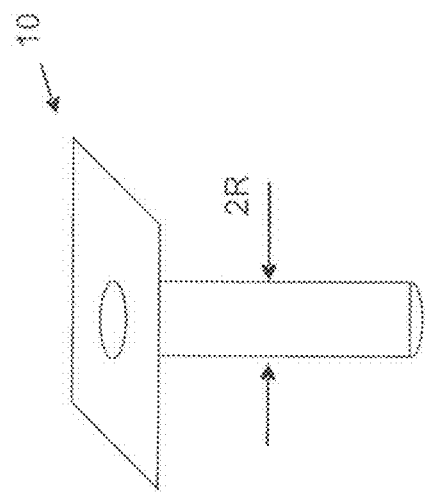
Figure 17E:
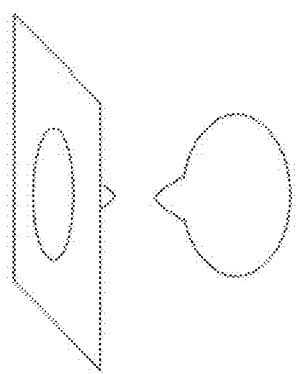
Figure 17F:
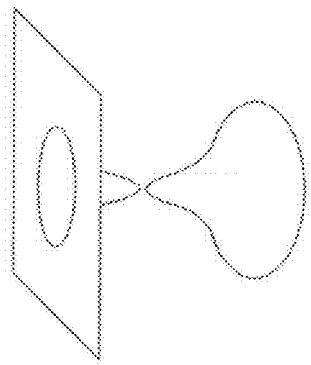
Figure 18B:
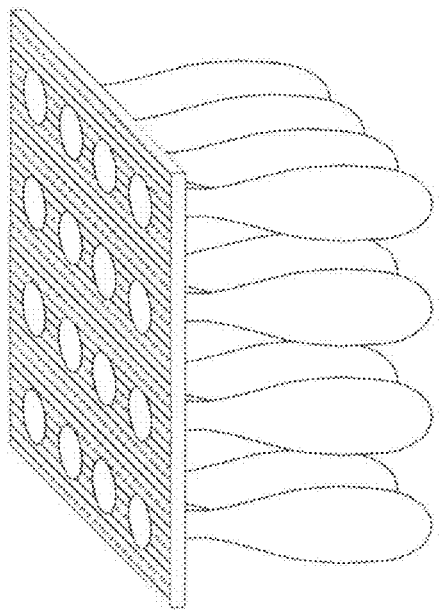
FIGS. 18a to 18d are respective schematic views of a plurality of trenches formed in a semiconductor substrate during the steps of a manufacturing method according to an embodiment of the invention.
Figure 18D:
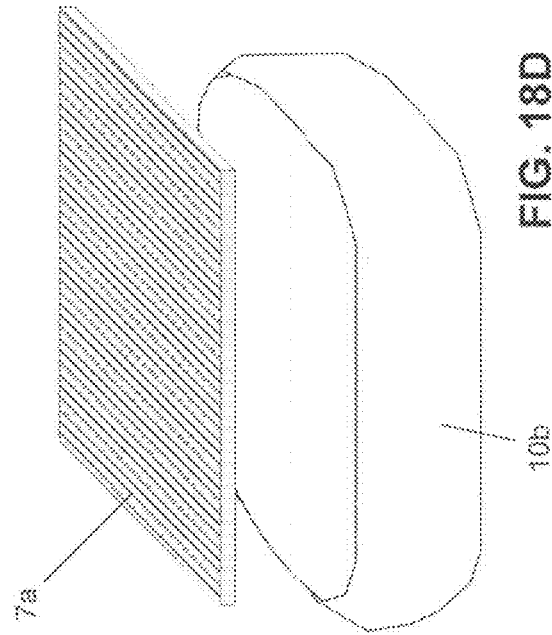
Figure 18A:
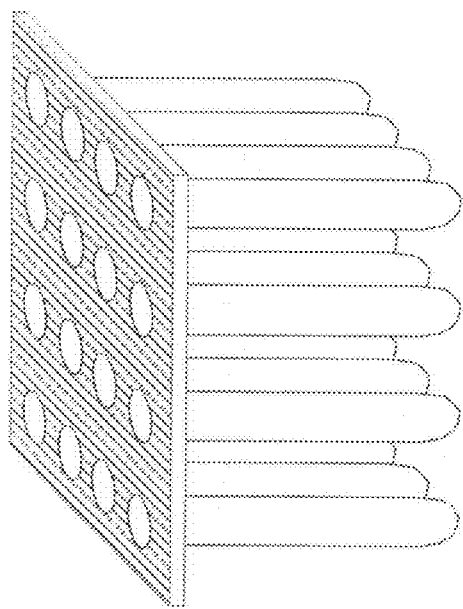
Figure 18C:
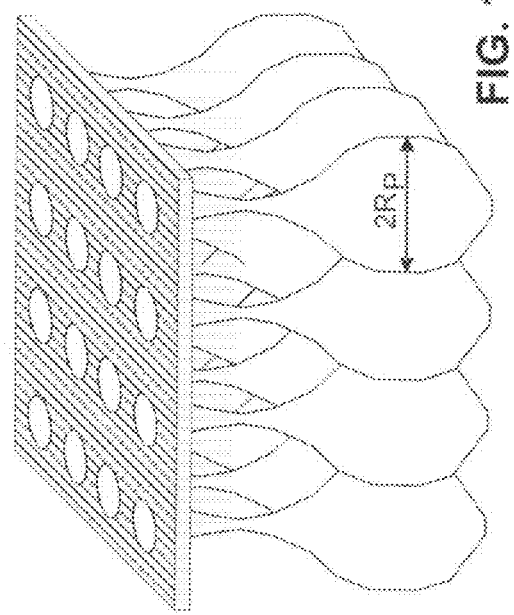

As shown in FIGS. 15 and 16, the structure thus obtained further is subjected to an oxidizing process, for example in oven, and given the large surface provided by the porous silicon layer 12 (~500 m²/cm³), the reactivity thereof and the small size of the crystalline structures therein, the porous silicon layer 12 is totally oxidized in significantly less time than the crystalline silicon typical oxidation rate, forming a dielectric layer 12a. Therefore, in the same time required to totally oxidize the porous silicon layer 12, on the surface only a very thin oxide layer is formed.

After the oxidation step the filling of the surface trenches 11 is performed through a dielectric layer formation step, for example by depositing a TEOS (Tetra Ethyl Orthosilane) layer or a PVAPOX layer. The surface dielectric layer is then removed, respectively for the case of the N-type substrate as shown in FIG. 15 and of the P-type substrate as shown in FIG. 16. The so-filled trenches 11 are the device or circuit integration edges, i.e. the "scribe lines".

Several additional embodiments of the invention are now described.

In a first embodiment of the process according to the invention, as shown in FIGS. 26a to 26f, on a substrate 7 through a traditional photolithographic technique are defined the geometries of trenches 10 to be formed.

Through an anisotropic removal some trenches 8 and 10 of predetermined size are opened.

An annealing step is performed at high temperature in a hydrogen environment so as to let the self-organizing surface migration process occur, which, by planarizing the substrate 7 surface, leaves the round-section channel 10b buried.

Nothing prevents these trenches 8 from being closed by a semiconductor material layer 9a formed on the substrate 7.

Once the "trench closing" is performed, a semiconductor material layer 9 is formed, as shown in FIG. 26c. This semiconductor material layer 9 is formed, for example, by epitaxial growth and with a dopant concentration being different from the substrate 7.

The semiconductor material layer 9 is formed in order to be selective during the porous layer formation. In alternative, a doped polysilicon layer is deposited, also in this case what has been said for the formation process selectivity due to the dopant type and quality is still valid.

Figure 26F:
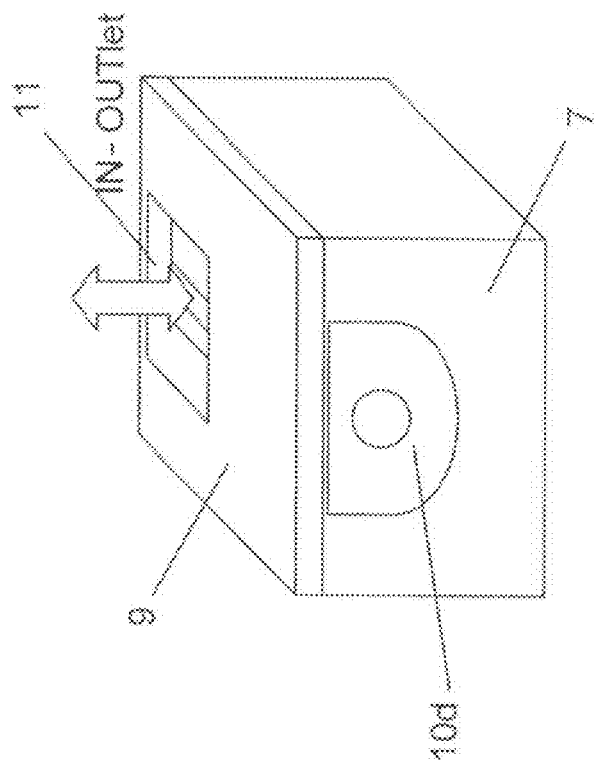

Through a masking step and an etching process some trenches 11 are Opened on the surface layer, which intersect the underlying microchannels 10b, which will serve as channel input, output as shown in FIG. 26f.

Figure 26E:
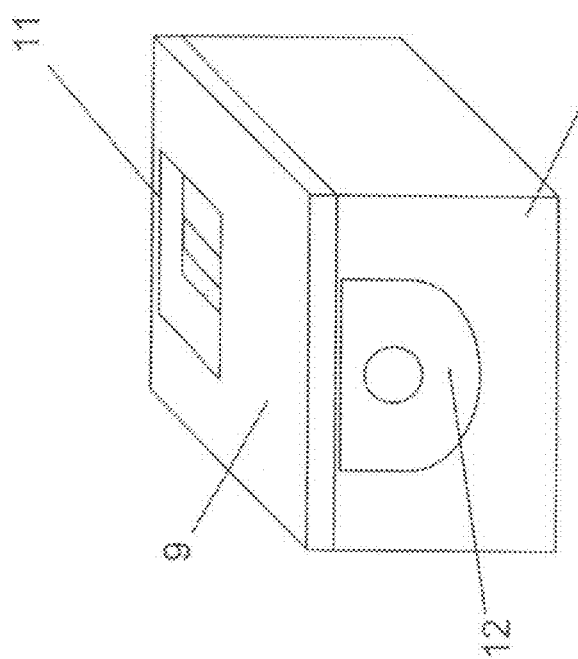

As shown in FIG. 26e the so-formed structure is then put in an hydrofluoric acid water solution and by electrochemical etching the porous silicon layer 12 is formed locally around the microchannel 10b and isotropically.

Through a basic etching, at room temperature, the porous silicon layer 12 is selectively removed, leaving therefore a far wider microchannel 10d than the microchannel formed by the thermal process. It is however possible to form surface trenches 11 after forming the microchannel 10d.

This embodiment is particularly advantageous in the microfluid field. In fact, by exploiting the self-organizing surface migration principle and the following porous silicon selective formation, buried microchannels for "lab on chip"-type applications are formed.

A second embodiment of the process according to the invention is shown in FIGS. 27a to 27g. The geometries of trenches 8 and 10 to be formed are defined on a substrate 7 through a traditional photolithographic technique.

Through an anisotropic removing process some trenches 10 of predetermined size are opened.

An annealing step is performed at high temperature in an hydrogen environment so as to let the self-organizing surface migration process occur, which, by planarizing the substrate 7 surface, leaves a depleted portion of microchannel 10b buried, whose form will depend directly on the geometry defined by trenches 10, covered by a layer 7a or membrane, totally formed by defectless crystalline silicon.

Once the "trench thermal closing" is completed, if it is necessary to have a membrane being more than some microns thick, an epitaxial growth of a semiconductor material layer 9 can be performed without any problem in order to reach the desired thickness.

If a higher thickness, and thus volume, of the microchannel 10b cavity is required, it may be necessary to grow epitaxially a further layer having a different doping with respect to the substrate 7 and being selective in the porous layer 12 formation. In the alternative, a doped polysilicon deposition can be performed. At this point, after opening on the surface small trenches 11 connecting the cavity 10b with the surface, the porous silicon layer 12 is formed, through an anodizing electrochemical process in an hydrofluoric acid solution. This porous silicon layer 12 is dissolved afterwards by a basic etching (KOH, NaOH, etc.).

Figure 27A:
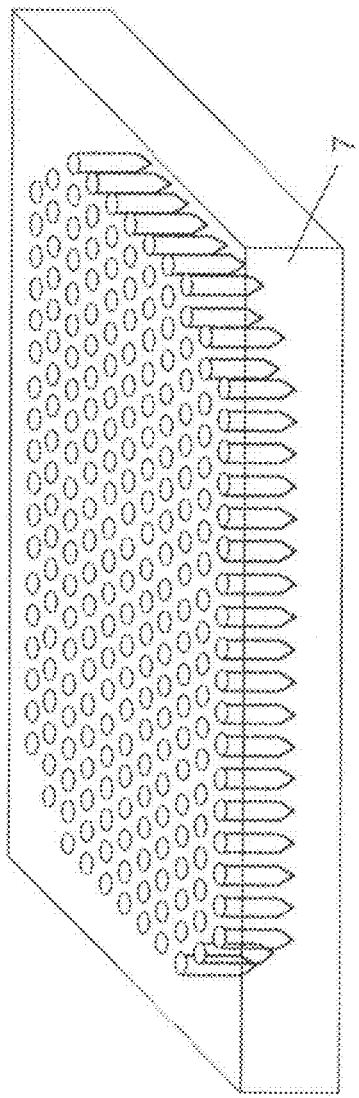
Figure 27B:
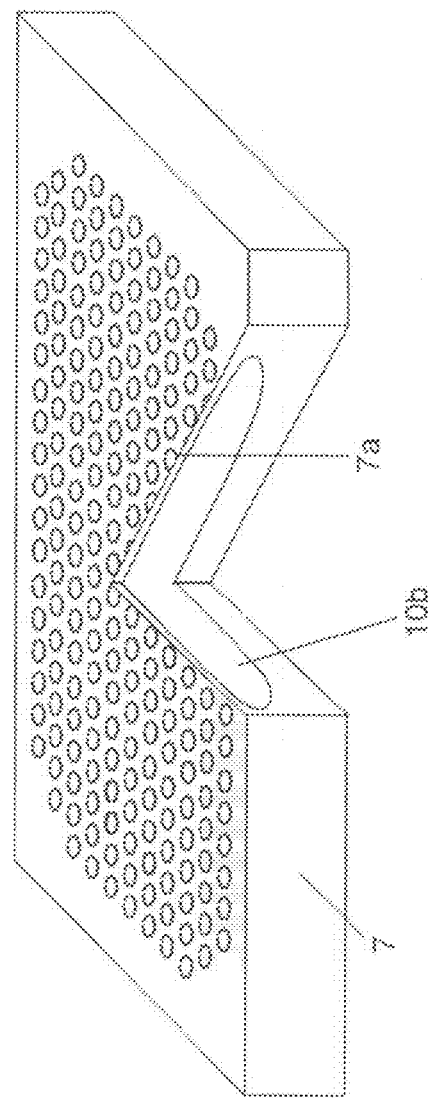
Figure 27E:
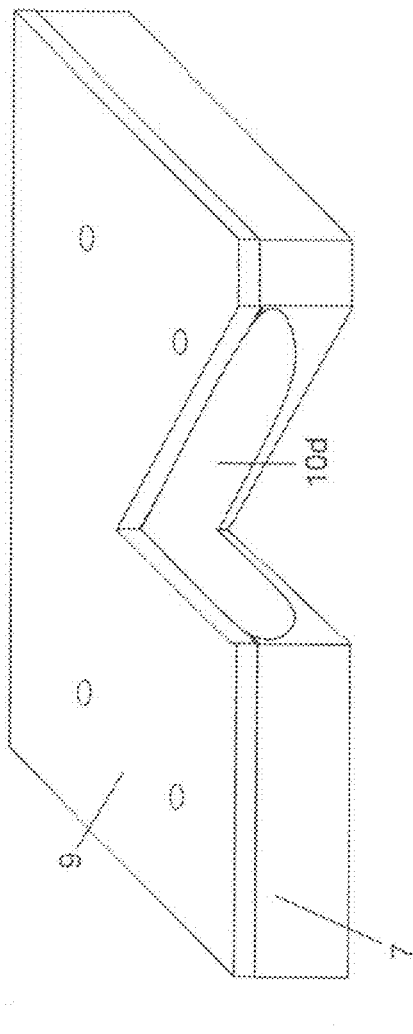

The final structure is shown in FIG. 27e, wherein an extension of the microchannel 10d cavity, being controllable as one likes, can just be seen. Obviously, trenches 11 previously opened on the semiconductor material layer 9 surface can be closed through a localized deposition process or be an integral part of the membrane geometry as in the case of a microphone.

Figure 27F:
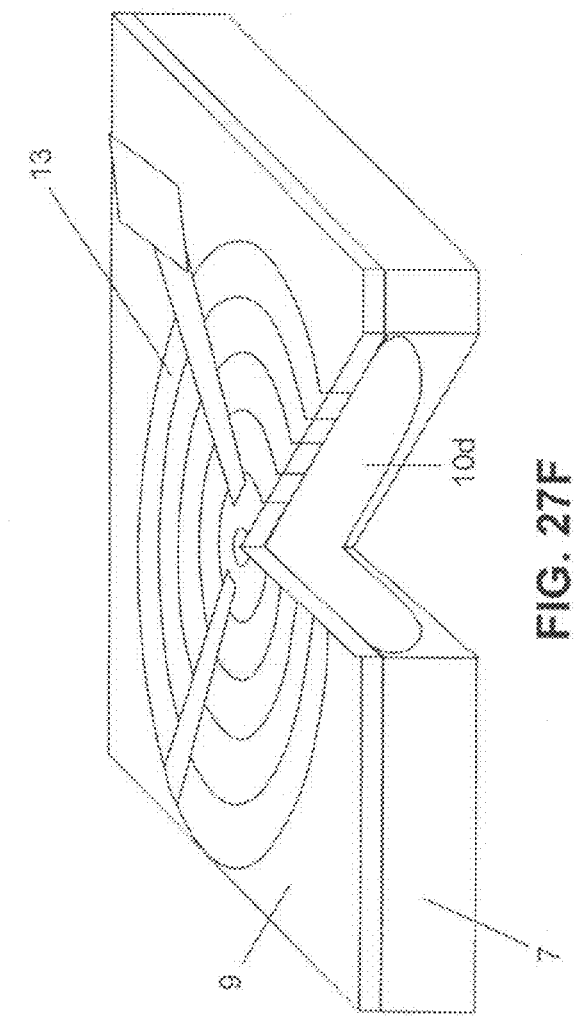

If a condenser microphone is to be formed as shown in FIG. 27f, after manufacturing the silicon membrane 7a, a metallization layer 13 is formed. This layer 12 is conveniently configured by means of traditional techniques. The metallization layer 13 is deposited on the membrane 7a, for example, by sputtering, and configured through a traditional photolithographic and etching technique. The metallization layer 13 is a first electric contact, while the second contact is the substrate 7 lower portion. In fact, since the substrate 7 is highly doped, it has excellent conductive features.

Figure 27G:
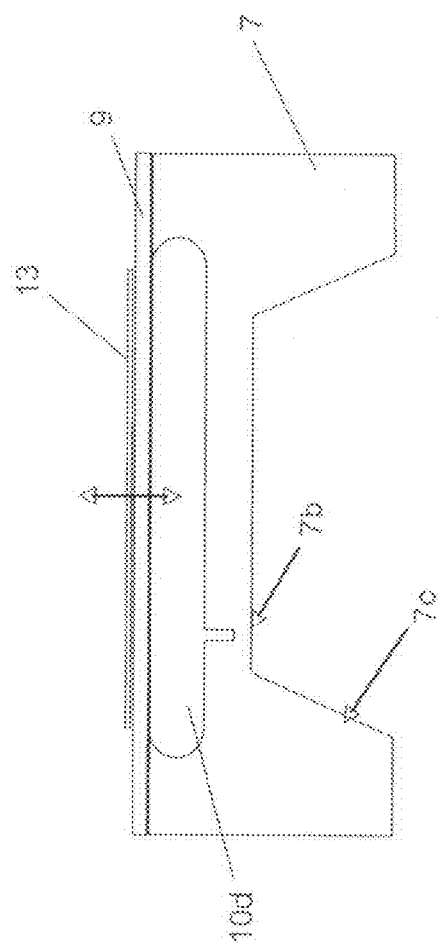

A second embodiment to obtain an integrated microphone is shown in FIG. 27g. This second embodiment provides a non-frontal communication port 7b of the microchannel 10b with the environment, i.e. from the membrane 7a itself, in the back side substrate 7, being obtained by forming a window 7c in the substrate 7 back side.

Figure 28A:
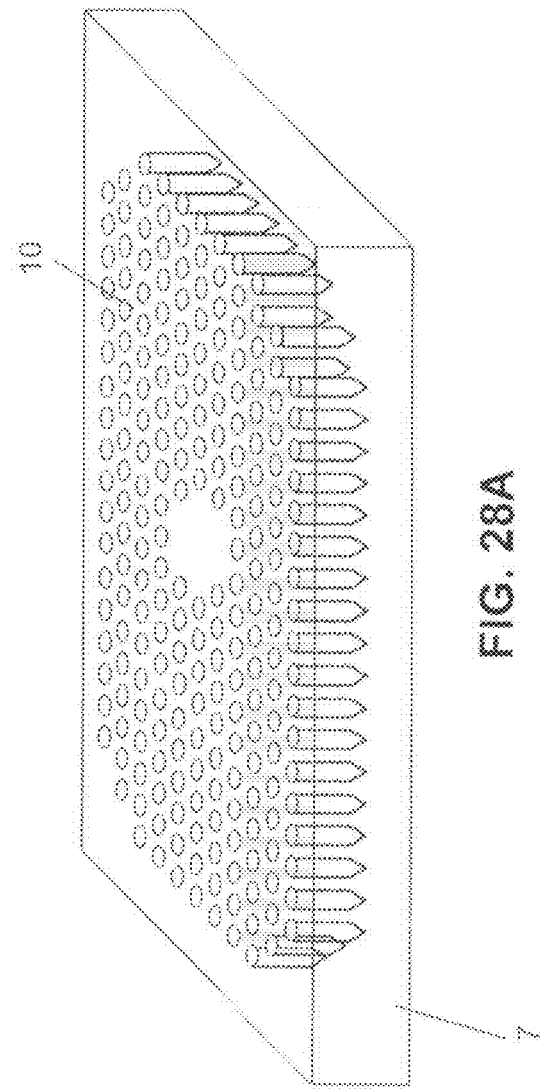
FIGS. 28a to 28c are respective schematic views of a third embodiment of the manufacturing method according to embodiments of the invention.
Figure 28B:
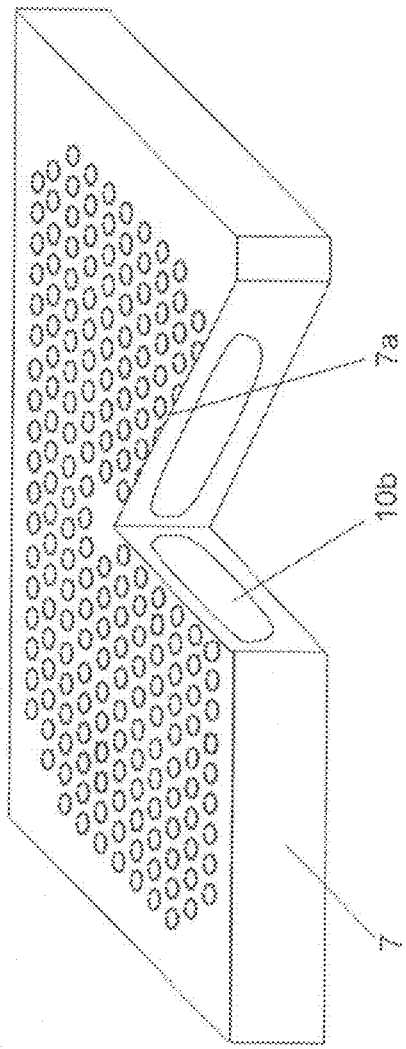
Figure 28C:
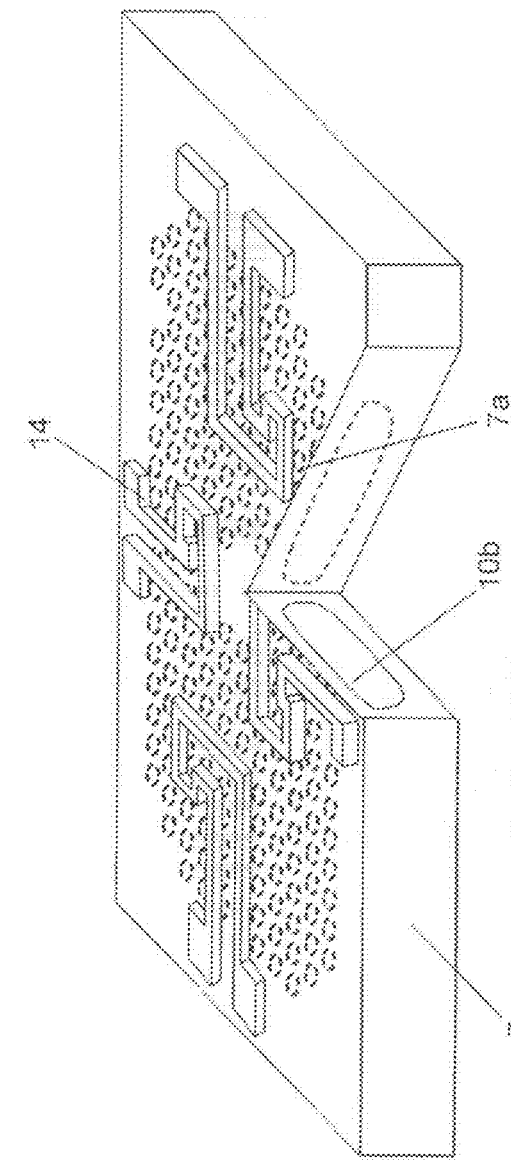

FIGS. 28a to 28c show a third embodiment of the method according to the invention. Particularly, a method for manufacturing a piezoresistive-type pressure sensor is described.

After defining the features to be possessed by a membrane, trenches 10 are defined on the substrate 7 by photolithography and anisotropic etching.

Afterwards, the annealing at high temperature is performed to form the buried microchannel 10b which will have the desired geometry previously defined.

After manufacturing the membrane 7a the thickening thereof or the microchannel 10b extension can be performed by forming a further layer. Finally a layer 14 of polysilicon or other material having piezoresistive features is deposited on the membrane and the geometries of the piezoresistors which will transduce the pressure variation signal into an easily-detectable electric signal are defined through photomasking and etching. A scheme of a pressure sensor structure is shown in FIG. 28c.

This third embodiment of the method according to the invention is thus particularly advantageous when manufacturing suspended structures, as in the case of microphones and pressure sensors, and generally in each device requiring a stiff membrane 7a.

Advantageously, the structure and geometry of the membrane 7a are formed with different features according to the pressure field to be undergone in the application in terms of rigidity, elasticity, thickness.

A fourth embodiment of the process according to the invention to manufacture a MOSFET transistor with buried channel (ISFET Ion sensitivity FET) is now described.

Figure 29A:
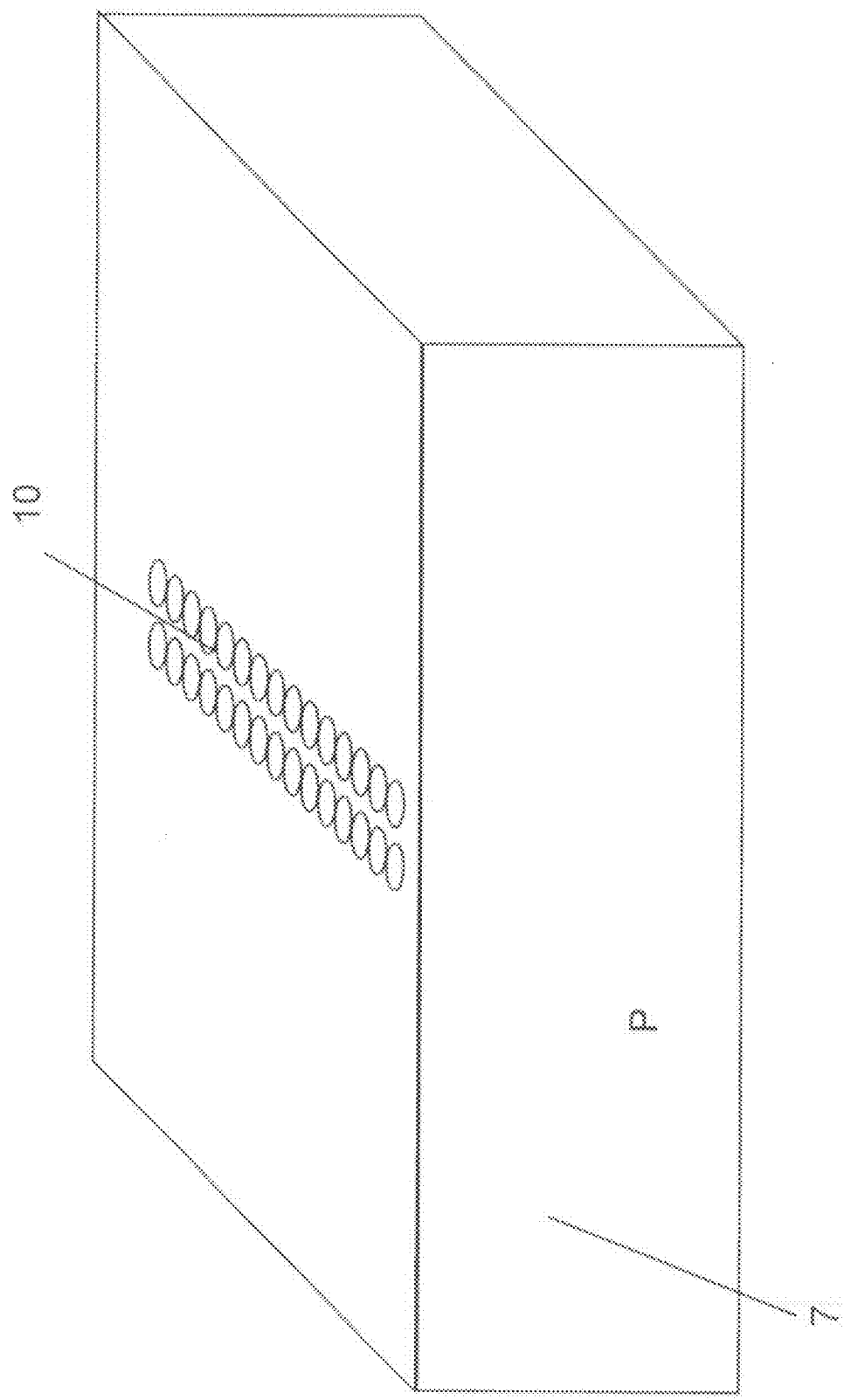

Trenches 10 with predetermined size are formed on the silicon substrate 7. FIG. 29a shows a series of cylindrically-developing trenches 10 being formed along two parallel lines.

Through a thermal process at high temperature in an hydrogen environment trenches are closed, in order to planarize the surface and leave a microchannel 10b buried.

Figure 29C:
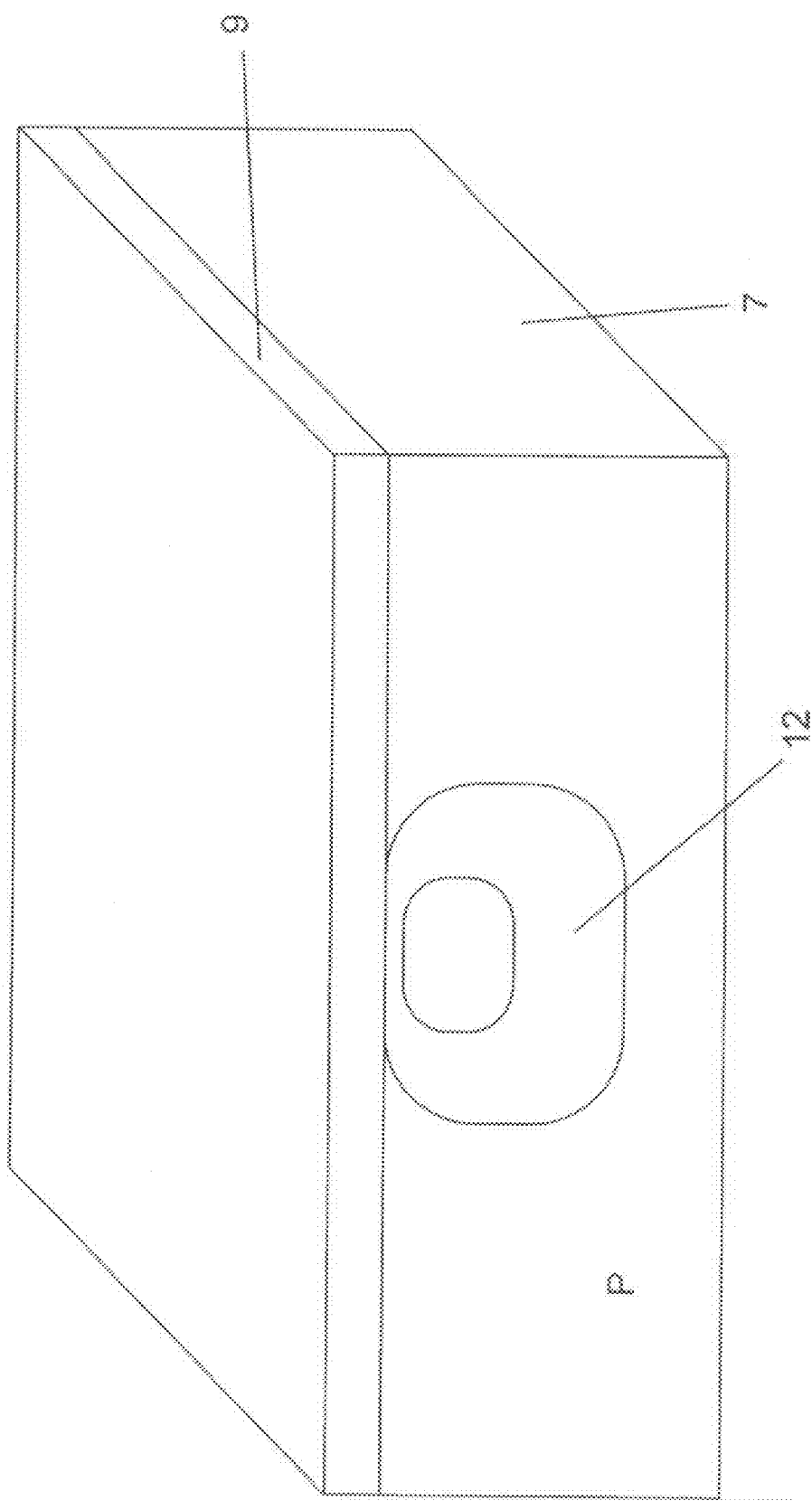
Figure 29E:
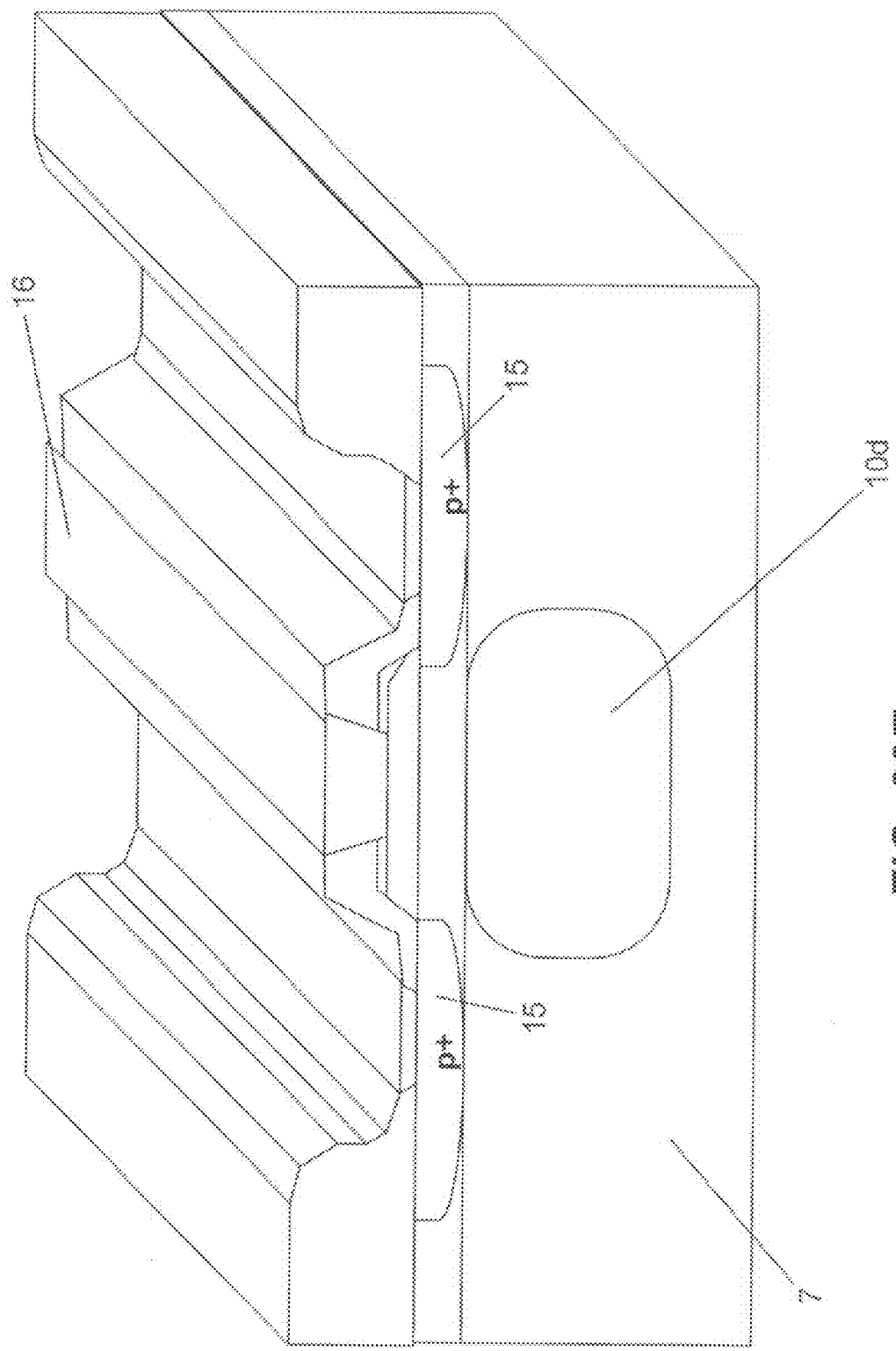

Advantageously, through a selective formation and removal process of transformation of the silicon layer into a porous silicon layer 12, the extension step of the buried microchannel 10d is performed, as shown in FIGS. 29c and 29d.

Advantageously, on the previously obtained structure, a semiconductor material layer 9 of the same type of material which will form the microchannel 10b is made to grow epitaxially.

Afterwards, drain and source regions 15 are formed in the substrate 7 or in the semiconductor material layer 9 if it is present. These drain and source regions are formed at the edges of the buried microchannel 10c being formed in the substrate 7.

A gate oxide layer and the MOSFET gate region 16 are then formed, as shown in FIG. 29d.

At this point the contacts of the MOSFET gate 16, drain and source 15 regions are formed conventionally.

The so-formed device will have, far from the electrode area, two large ports according to the application and the package type, which intercept the buried microchannel 10b 10d and serve as inlet/outlet, through which gases can go in and out, and the solutions which will be required to etch chemically the surface or which are to be monitored by the system.

Obviously the MOSFET manufactured with the method according to embodiments of the invention will be biased in a static way by means of surface electric contacts in the transistor active area. The interaction with the solutions and molecules anchored to the inner surface of the buried microchannel 10b will produce a modulation of the MOSFET channel which, if detected, allows the chemical composition of the fluids which are caused to flow in the buried microchannel 10b to be studied in real-time.

An application of an ISMOSFET transistor manufactured with a method according to an embodiment of the invention is for example the detection of the AND anchorage for determining the genetic expression.

In fact ISFETs (Ion sensitivity FET) manufactured with a method according to an embodiment of the invention are sensitive to the changes induced by the chemical bonds between the molecules and the surface of the buried microchannel 10b. This device allows, after a convenient calibration, PH, charge, molecular bond changes to be studied and detected.

In conclusion, the above-described methods allow SOI structures to be manufactured, which are to be used in the manufacturing of fast electronic circuits having reduced costs which affect negligibly the product final price.

In fact these substrates are formed only by combining different techniques, such as wet etching of the silicon surfaces for trench definition, electrochemical etching of the crystalline silicon for porous silicon formation, exploitation of the selectivity with respect to the dopant type and quantity of the crystalline substrate of this etching, exploitation of the crystalline silicon surface self-organization properties and, finally, epitaxial growths.

Therefore, devices are manufactured, which combine the crystalline silicon surface self-organization technique with the following formation of a conductive layer, the selective formation of a porous silicon layer 12 around the cavity 10b and the following oxidation thereof, the hole through the already-formed buried cavities 10b (microchannels) allowing a porous silicon buried layer to be uniformly formed around the cavities 10b. Advantageously, layer 12 is oxidized. This layer 12 can be then removed with a very short etching time. The so-formed SOI substrates easily allow therefore traditional electronic devices to be integrated on the so-formed surface portion. Also, the cavity 10b can remain void (or be made void by removal of the layer 12) to allow formation of other devices such as microphones, transducers, and ISFETs. An integrated circuit having such a substrate structure can be used in electronic systems such as computer system.

From the foregoing it will be appreciated that, although specific embodiments of the invention have been described herein for purposes of illustration, various modifications may be made without deviating from the spirit and scope of the invention.

What is claimed is:

1. A method for manufacturing a semiconductor substrate of a first type of concentration and comprising at least one buried insulating cavity, comprising the following steps:
   forming on said semiconductor substrate a plurality of trenches,
   forming a surface layer on said semiconductor substrate in order to superficially close said plurality of trenches forming in the meantime said at least one buried cavity in correspondence with the surface-distal end of said trenches;
   forming a first layer on said surface layer; and
   forming in the first layer at least one trench being in communication with said at least one buried cavity.

2. A method for manufacturing a semiconductor substrate according to claim 1 wherein said semiconductor substrate is subjected to an electroerosive process to turn a portion of said semiconductor substrate located in correspondence with said at least one buried cavity into a porous silicon layer.

3. A method for manufacturing a semiconductor substrate according to claim 1 wherein said porous silicon layer is subjected to an oxidizing process to form a dielectric layer between said surface layer and a semiconductor substrate lower portion.

4. A method for manufacturing a semiconductor substrate according to claim 2 wherein said porous silicon layer is removed to form a second buried cavity with a wider width than said at least one starting buried cavity.

5. A method for manufacturing a semiconductor substrate according to claim 1 wherein said plurality of trenches is formed by grooves being parallel to each other in the substrate.

6. A method for manufacturing a semiconductor substrate according to claim 1 wherein said plurality of trenches are formed by cylindrically-developing openings in the substrate.

7. A method for manufacturing a semiconductor substrate according to claim 1 wherein said surface layer is formed through an annealing step in a non-oxidizing atmosphere on all said semiconductor substrate.

8. A method for manufacturing a semiconductor substrate according to claim 1 wherein said surface layer is formed through a semiconductor material surface layer formed on the substrate.

9. A method for manufacturing a semiconductor substrate according to claim 1 wherein said semiconductor material surface layer is formed on the substrate through epitaxy.

10. A method for manufacturing a semiconductor substrate according to claim 1 wherein it comprises the following steps:
form the first layer on said surface layer having the same concentration as said semiconductor substrate.

11. A method, comprising:
forming openings in a substrate;
closing the openings to form at least one cavity within the substrate;
forming a first layer on the substrate after the operation of closing the openings; and
forming at least one trench in the first layer, each trench extending through the first layer and through the substrate to at least one cavity within the substrate.

12. The method of claim 11 wherein forming openings comprises forming trenches in the substrate.

13. The method of claim 11 wherein forming openings comprises forming rows of cylindrical openings in the substrate.

14. The method of claim 11 wherein closing the openings comprises heating the substrate.

15. The method of claim 11 wherein closing the openings comprises heating the substrate to approximately 1000° C.-1300° C. for at least ten minutes in a non-oxidizing environment.

16. The method of claim 11 wherein closing the openings comprises forming a layer on the substrate to cover the openings.

17. The method of claim 11, further comprising forming a buried dielectric layer by converting a wall of the cavity into a dielectric material.

18. The method of claim 11, further comprising:
forming an opening to the cavity; and
forming a buried dielectric layer by converting a wall of the cavity into dielectric material via the opening.

19. The method of claim 11, further comprising:
converting a wall of the cavity into porous silicon; and
forming a buried dielectric layer by oxidizing the porous silicon.

20. The method of claim 11, further comprising enlarging the cavity.

21. The method of claim 11, further comprising:
converting a wall of the cavity into a material that is different than the material from which the substrate is formed; and
enlarging the cavity by removing the material.

22. The method of claim 11, further comprising:
converting a wall of the cavity into porous silicon; and
enlarging the cavity by removing the porous silicon.

* * * * *